(12) United States Patent
Nagata et al.

(10) Patent No.: US 7,088,330 B2
(45) Date of Patent: Aug. 8, 2006

(54) ACTIVE MATRIX SUBSTRATE, DISPLAY DEVICE AND METHOD FOR DRIVING THE DISPLAY DEVICE

(75) Inventors: Hisashi Nagata, Nara (JP); Noboru Noguchi, Tenri (JP); Tomohiko Yamamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 148 days.

(21) Appl. No.: 10/024,065

(22) Filed: Dec. 18, 2001

(65) Prior Publication Data

US 2002/0080109 A1    Jun. 27, 2002

(30) Foreign Application Priority Data

Dec. 25, 2000  (JP)  ............................. 2000-392065
Dec. 26, 2000  (JP)  ............................. 2000-395840

(51) Int. Cl.
*G09G 3/36*    (2006.01)

(52) U.S. Cl. ........................... 345/100; 345/92; 345/98

(58) Field of Classification Search .......... 345/87–104
See application file for complete search history.

(56) References Cited

U.S. PATENT DOCUMENTS

| | | | |
|---|---|---|---|
| 4,694,287 A | | 9/1987 | Chenevas-Paule et al. |
| 5,095,304 A | * | 3/1992 | Young ........................ 345/92 |
| 5,165,075 A | * | 11/1992 | Hiroki et al. ................. 349/48 |
| 5,784,042 A | * | 7/1998 | Ono et al. .................... 345/94 |
| 5,995,073 A | * | 11/1999 | Isami et al. .................. 345/89 |
| 6,031,515 A | * | 2/2000 | Okamoto ................... 345/100 |
| 6,157,358 A | * | 12/2000 | Nakajima et al. ............. 345/96 |
| 6,304,241 B1 | * | 10/2001 | Udo et al. .................... 345/96 |
| 6,404,414 B1 | * | 6/2002 | Ishii ............................ 345/90 |
| 6,424,328 B1 | * | 7/2002 | Ino et al. ..................... 345/87 |

(Continued)

FOREIGN PATENT DOCUMENTS

JP    62-178927    8/1987

(Continued)

OTHER PUBLICATIONS

U.S. Appl. No. 09/803,509, pending application, Hisashi Nagata, et al., filed Mar. 9, 2001.

(Continued)

*Primary Examiner*—Bipin Shalwala
*Assistant Examiner*—David L. Lewis
(74) *Attorney, Agent, or Firm*—David G. Conlin; William J. Daley, Jr.; Edwards, Angell, Palmer & Dodge, LLP

(57) ABSTRACT

An active matrix substrate includes: a base plate; pixel electrodes formed on the base plate; pixel switching elements, each being connected to associated one of the pixel electrodes; gate lines for controlling operations of the pixel switching elements; data lines, each being connected to associated ones of the pixel electrodes by way of associated ones of the pixel switching elements so as to supply a data signal therethrough; data line switching elements, each having one of its terminals connected to associated one of the data lines; signal input terminals, each being electrically connected to another terminal at associated ones of the data line switching elements; a data line branching section provided between the signal input terminals and the data line switching elements; and a control line connected to the data line switching elements to selectively turn ON or OFF the data line switching elements. A signal to turn ON the data line switching elements and a signal to turn ON the pixel switching elements have mutually different polarities.

27 Claims, 8 Drawing Sheets

U.S. PATENT DOCUMENTS

| | | | |
|---|---|---|---|
| 6,441,758 B1 * | 8/2002 | Koyama et al. | 341/136 |
| 6,522,315 B1 * | 2/2003 | Ozawa et al. | 345/92 |
| 6,538,630 B1 | 3/2003 | Tanaka et al. | |
| 6,559,821 B1 * | 5/2003 | Ichikawa et al. | 345/92 |
| 6,703,997 B1 * | 3/2004 | Murade | 345/92 |
| 2001/0005193 A1 * | 6/2001 | Yokoyama | 345/92 |
| 2001/0020929 A1 * | 9/2001 | Nagata et al. | 345/98 |
| 2002/0101398 A1 * | 8/2002 | Fujita | 345/90 |

FOREIGN PATENT DOCUMENTS

| | | |
|---|---|---|
| JP | 06-067200 | 3/1994 |
| JP | 08-234237 | 9/1996 |
| JP | 11-052420 | 2/1999 |
| JP | 11-095726 | 4/1999 |
| JP | 11-183870 | 7/1999 |
| JP | 11-191237 | 7/1999 |
| JP | 11-271714 | 10/1999 |
| JP | 11-288255 | 10/1999 |
| JP | 11-326934 | 11/1999 |

OTHER PUBLICATIONS

Higuchi, et al., "Electronic Circuits for Information Systems", vol. II, pp. 44-47, 1989.

Tanaka, et al., "An LCD Addressed by a Si:H TFTs with Peripheral poly-Si TFT Circuits", IEDM93, pp. 389-392, 1993 IEEE.

Kato, et al., "Ar+Laser Annealed Poly-Si TFTs for Large Area LCDs" Euro Display '96, pp. 551-554, 1996.

* cited by examiner

ACTIVE MATRIX SUBSTRATE, DISPLAY DEVICE AND METHOD FOR DRIVING THE DISPLAY DEVICE

BACKGROUND OF THE INVENTION

1. Field of the Invention

The present invention relates to an active matrix substrate for use in a display device, for example, and also relates to a display device including an active matrix according to the present invention and a method for driving such a display device.

2. Description of the Related Art

A conventional active-matrix-addressed liquid crystal display device has a liquid crystal panel structure including an active matrix substrate and a counter substrate. A counter electrode, commonly used for a plurality of pixels, is formed on the counter substrate. The pixels, data lines for supplying display signals to the pixels, switching elements associated with the respective pixels, and gate lines for controlling the operations of those switching elements are formed on the active matrix substrate. A structure like this will be herein referred to as a "first conventional structure" for the sake of convenience. In this first conventional structure, external drivers such as source and gate driver ICs (which will herein sometimes be referred to as "drivers" collectively), each having the same number of output terminals as that of the data or gate lines, are provided for the liquid crystal panel to drive the data and gate lines.

However, an alternative display device structure was proposed to reduce the number of external drivers needed and the cost of mounting those drivers on the liquid crystal panel. In that alternative structure (which will be herein referred to as a "second conventional structure" for convenience sake), the number of integrated circuits (ICs) is cut down to a half or a third, each output of each of the ICs is branched into two or three, and an appropriate one of those outputs is selectively supplied via a data line switching element. Hereinafter, this structure will be described in further detail.

As in the normal liquid crystal panel (i.e., the first conventional structure), the far ends of the data lines are also electrically connected to their associated source driver ICs, which are among the external drivers needed for the second conventional structure. In this second structure, however, the number of source driver ICs needed is halved, for example. In addition, a data line branching section is also connected to those source driver ICs so as to branch each output of the source driver ICs into two and thereby match the number of branched outputs of the source driver ICs to that of the data lines. And data line switching elements are provided between the data line branching section and the ends of the data lines. Furthermore, a control signal input line is connected in common to the gates of its associated ones of the data line switching elements that belong to a single block. A control signal, which selectively turns ON or OFF the switching elements, is supplied through the control signal input line. The outputs (signals) of each source driver IC, which have been branched by the data line branching section, are supplied to their associated data lines on a sequential basis.

This second conventional structure is disclosed in Japanese Laid-Open Publication No. 8-234237, for example. According to this publication, this structure is advantageous not only in that the number of external drivers required can be reduced but also in that the external drivers can be easily mounted along a single side. In the technique described in this publication, one of the gate lines is selected on a block-by-block basis, while one of two adjacent data lines is selected using a switching element. However, even if one of the data lines is selected on a block-by-block basis, the same effects and advantages are achievable and each of the external drivers can have its configuration rather simplified.

A third conventional structure for an activematrix-addressed liquid crystal display device was proposed in U.S. Pat. No. 4,694,287, for example. The display device disclosed in this patent includes: a counter substrate, on which not the common counter electrode but the data lines are provided; and another substrate on which pixel electrodes, common lines for applying a predetermined potential to pixels, switching elements for the respective pixels, and gate lines for driving the pixels are formed. According to the patent identified above, when the data lines and the gate lines are formed on mutually different substrates, a decreased capacitance is associated with each of those data lines to reduce the load on the driver and a short-circuit failure, usually occurring at an intersection between the data and gate lines, is avoidable.

However, in the first conventional structure in which the pixel electrodes, data lines, switching elements and gate lines are all formed on the same substrate, when one of the pixels is selected responsive to a scan signal supplied through one of the gate lines, the scan signal changes from logical one state to logical zero state. At this particular point in time, the potential level of the liquid crystal layer is slightly dropped by a parasitic capacitance formed between the gate line and the pixel electrode. To avoid image persistence (i.e., undesired image retention), a voltage to be applied to the liquid crystal layer should have its DC component removed. Accordingly, in the first structure, the potential level of the counter electrode on the counter substrate should be regulated with that drop in potential taken into account. The slight drop in potential is also observed in the third conventional structure when a gate line changes from a selected state into a non-selected state. In that case, the potential to be applied to the common lines or the potential levels of the data lines on the counter substrate should be regulated.

Furthermore, the second conventional structure, in which the pixel electrodes, data lines, pixel switching elements and gate lines are formed on the same substrate and in which a video signal (or data signal) is supplied to one of the data lines via a data line switching element, also has the following problems. Specifically, not only 1) when the scan signal changes from logical one into logical zero but also 2) when the data line switching element changes from a selected state into a non-selected state, a parasitic capacitance, which has been created between the control signal input line for the switching element and the data line, drops the potential level of the liquid crystal layer. That is to say, this drop in potential level is superposed on the voltage to be applied to the liquid crystal layer. In addition, the pixel electrodes and the data lines are formed on the same substrate through the same fabrication process. Accordingly, the data line switching elements are of the same type as the pixel switching elements. Thus, the data line and pixel switching elements are both selected (i.e., turned ON) when the scan signal is logical one, and are both non-selected (i.e., turned OFF) when the scan signal is logical zero. Therefore, the drop in potential in the situation 1) and the drop in potential in the situation 2) have the same polarity. For that reason, a voltage, which is greatly different from the direct current component of the signal on the data line (i.e., a display signal), should be applied to the counter electrode to compensate for the drop in potential level.

Furthermore, to allow the driver to decrease its breakdown voltage or to further reduce the power dissipation thereof, a voltage having a waveform of constant amplitude (which will be herein referred to as a "correction voltage") is usually applied to the counter electrode (or common electrode) in a situation where the data line driver (i.e., the source driver IC) should have a further narrowed drive voltage range. As for the third conventional structure, however, the correction voltage is applied to the common lines, not to the counter electrode.

In this case, a voltage to be applied to the data lines is relatively determined with respect to the correction voltage and changed with the type of the image to be displayed. For example, suppose variations in voltages to be applied to the counter electrode and the data lines with time are observed in a situation where a still image (or fixed image) is displayed. In this case, a voltage of constant amplitude (i.e., the correction voltage) is applied to the counter electrode, while a voltage, having a waveform of which the phase and amplitude have been so controlled as to be of common or opposite to those of the correction voltage depending on the type of the image to be displayed, is applied to the data lines. If the correction voltage has a relatively great level, then the voltage to be applied to the data lines can fall within the amplitude range of the correction voltage in any display mode. However, if the potential level of the liquid crystal layer is dropped significantly by both the pixel and data line switching elements, for example, the drive voltage range of the data lines may sometimes exceed that of the counter electrode. In that case, the voltage should be generated by newly providing another power supply for the data lines separately from the power supply for the counter electrode, thus increasing the power dissipation disadvantageously.

When the potential level of the liquid crystal layer is dropped by a switching element, it depends on the magnitude of a parasitic capacitance unique to the switching element how much the potential level is dropped. However, in a normal manufacturing process of liquid crystal panels, the magnitude of a parasitic capacitance of switching elements is often changeable from one cell to another. This is because in a normal manufacturing process, the gate insulating film of transistors functioning as the switching elements belonging to one cell often has a thickness or line width different from that of the gate insulating film of transistors belonging to another cell. The thickness or line width often shifts from one lot to another during the manufacturing process or from one substrate to another within the same lot. The shift is also caused by a positional displacement of a cell being placed on the substrate.

When a direct current (DC) component is applied to the liquid crystal layer, the reliability might decrease (e.g., the image persistence might occur). Accordingly, to eliminate the DC component, highly precise adjustment is required by using a counter voltage (or correction voltage) regulating volume that is provided externally for each display device.

However, in the second conventional structure in which the dedicated switching elements are provided for the data lines, the potential drop caused by the pixel switching elements is superposed on the potential drop caused by the data line switching elements as described above. Accordingly, the voltage to be applied to the liquid crystal layer is changeable more greatly. As a result, the counter voltage level (or the correction voltage level) should be regulable in a broader range. For example, two volumes may have to be provided: one for regulating the counter voltage level roughly and the other for regulating the voltage level finely. In that unwanted situation, the number of parts required increases and the cost also increases disadvantageously. Furthermore, if the potential drop is so great that the correction voltage level should have a range covering both positive and negative domains across the ground level, then two regulators for positive and negative potentials should be prepared, thus further increasing the manufacturing cost adversely.

SUMMARY OF THE INVENTION

In order to overcome the problems described above, an object of the present invention is to provide a display device in which the voltage to be applied to a display medium layer does not change so much even when the switching elements turn ON or OFF.

Another object of the present invention is to provide a method for driving such a display device.

A display device according to a first aspect of the present invention includes: an active matrix substrate; a counter electrode; a display medium layer interposed between the active matrix substrate and the counter electrode; and a plurality of pixels. The active matrix substrate includes: a base plate; a plurality of pixel electrodes formed on the base plate, each said pixel electrode being associated with one of the plurality of pixels; a plurality of pixel switching elements, each said pixel switching element being connected to associated one of the pixel electrodes; a plurality of gate lines for controlling operations of the pixel switching elements; a plurality of data lines, each said data line being connected to associated ones of the pixel electrodes by way of associated ones of the pixel switching elements so as to supply a data signal therethrough; a plurality of data line switching elements, each said data line switching element having terminals, one of said terminals being connected to associated one of the data lines; a plurality of signal input terminals, each said signal input terminal being connected to another terminal of associated one of the data line switching elements and another terminal of another associated one of the data line switching elements; a data line branching section, which is provided between the signal input terminals and the data line switching elements; and a control line, which is connected to the data line switching elements to selectively turn ON or OFF the data line switching elements. A signal to turn ON the data line switching elements and a signal to turn ON the pixel switching elements have mutually different polarities.

In this display device, the data lines and the pixel electrodes are formed on the same substrate, and a signal to turn ON the data line switching elements and a signal to turn ON the pixel switching elements have mutually different polarities. Accordingly, when a potential level on the data lines is raised (or dropped) by the data line switching elements, a potential level at the pixel electrodes is dropped (or raised) by the pixel switching elements. That is to say, the potential rise caused by one of these two types of switching elements is canceled by the potential drop caused by the other type of switching elements. Thus, the DC level of the counter electrode will not be greatly different from that of the data lines. As a result, no power is dissipated in vain to newly generate an additional voltage.

The pixel and data line switching elements may be implemented as thin-film transistors, MIM elements or varistors, for example.

In one preferred embodiment of the present invention, each said pixel switching element and each said data line switching element may be thin-film transistors that have substantially the same channel length. In that case, a ratio of a channel width of each said pixel switching element to an electrostatic capacitance of associated one of the pixels is preferably substantially equal to a ratio of a channel width of each said data line switching element to an electrostatic capacitance of associated one of the data lines. In such an embodiment, the drop (or rise) in potential level at the pixel electrodes as caused by the pixel switching elements becomes substantially equal to the rise (or drop) in potential level on the data lines as caused by the data line switching elements. As a result, the data lines and the counter electrode have substantially the same DC level, and can be driven by a single power supply, thus avoiding the unwanted situation where an additional voltage should be generated newly. Also, there is no need to try to eliminate a variation in potential drop among respective active matrix substrates. Consequently, the number of parts required is reduced and the time and trouble of fine adjustment is saved, thus cutting down the overall manufacturing cost.

In another preferred embodiment of the present invention, each said pixel switching element and each said data line switching element are thin-film transistors, which have channels extending in parallel with each other. In such an embodiment, even if a pattern shift or misalignment has occurred during the manufacturing process, the drop (or rise) in potential level at the pixel electrodes as caused by the pixel switching elements is still substantially equal to the rise (or drop) in potential level on the data lines as caused by the data line switching elements. Accordingly, the DC level of a signal on the data lines will not be different from that of a signal at the counter electrode. As a result, the trouble of fine adjustment is saved and the unwanted increase in number of parts required is avoidable.

In still another preferred embodiment, each said pixel switching element may be either an n-channel transistor or a p-channel transistor. If the pixel switching element is an n-channel transistor, each said data line switching element is preferably a p-channel transistor. On the other hand, if the pixel switching element is a p-channel transistor, the data line switching element is preferably an n-channel transistor.

In this particular embodiment, the pixel switching element may be an n-channel transistor and the data line switching element may be a p-channel transistor.

In yet another embodiment, each said pixel switching element may be either an n-channel transistor or a p-channel transistor, while each said data line switching element may include a p-channel transistor and an n-channel transistor that are connected in parallel with each other. In the data line switching element, one of the p- and n-channel transistors that has a polarity different from that of the pixel switching element may have a channel length or channel width greater than that of the other transistor.

In yet another preferred embodiment, each said pixel switching element and each said data line switching element may both have a semiconductor layer, which has been deposited on the base plate, as a transistor active region.

In a preferred embodiment of the present invention, the display medium layer is a liquid crystal layer.

An active matrix substrate according to the first aspect of the present invention includes all of the components of the active matrix substrate described above. In this second active matrix substrate, each said pixel switching element is an n-channel transistor or a p-channel transistor, while each said data line switching element includes an n-channel transistor and a p-channel transistor that are connected in parallel with each other. In the data line switching element, one of the n- and p-channel transistors that has a polarity different from that of the pixel switching element has a channel length or channel width greater than that of the other transistor.

Another active matrix substrate according to the first aspect of the present invention includes base plate, pixel electrodes, pixel switching elements, gate lines, data lines, data line switching elements, signal input terminals, data line branching section and control line. The pixel electrodes are formed on the base plate. Each of the pixel switching elements is connected to associated one of the pixel electrodes. The gate lines are used for controlling operations of the pixel switching elements. Each of the data lines is connected to associated ones of the pixel electrodes by way of associated ones of the pixel switching elements so as to supply a data signal (e.g., video signal) therethrough. Each of the data line switching elements has a plurality of terminals, one of which is connected to associated one of the data lines. Each of the signal input terminals is connected to another terminal of associated one of the data line switching elements and to another terminal of another associated one of the data line switching elements. The data line branching section is provided between the signal input terminals and the data line switching elements. The control line is connected to the data line switching elements to selectively turn ON or OFF the data line switching elements. In this active matrix substrate, a signal to turn ON the data line switching elements and a signal to turn ON the pixel switching elements have mutually different polarities.

Another display device according to the first aspect of the present invention includes a display region unit. The display region unit includes: a substrate on which a plurality of pixels are arranged in columns and rows; a driver for driving the pixels; and switching means, formed on the substrate, for changing an electrical connection state between the pixels and the driver. The switching means includes: a first switching element located closer to one of the pixels; and a second switching element located closer to the driver. A signal to turn ON the first switching element and a signal to turn ON the second switching element have mutually different polarities.

An inventive method for driving the display device according to the first aspect of the present invention is characterized by driving the display device in such a manner that an interval, in which one of the pixel switching elements is turned OFF to hold a potential level of associated one of the data lines as written on associated one of the pixel electrodes, overlaps at least partially with an interval, in which one of the data line switching elements that is associated with the data line is turned OFF to hold a potential level of the data signal on the data line, for the pixel electrode and the counter electrode that face each other via the display medium layer.

The display device is preferably driven so that an interval, in which one of the pixel switching elements is turned OFF, overlaps at least partially with an interval, in which one of the data line switching elements is turned OFF to hold a potential level of the data signal as written on associated one of the data lines. In that case, in the overlapping interval in which these switching elements are both OFF, the pixel electrode holds a potential level lower than the gate line potential by the feedthrough voltage, while the data line holds a potential level lower than the data signal potential by the feedthrough voltage. As a result, a desired voltage, from which the potential variation corresponding to the feedthrough voltage has been canceled (and which is approximately equal to a potential difference between the data signal potential and the counter electrode potential), is applied to the display medium layer between the pixel electrode and the counter electrode.

A display device according to a second aspect of the present invention includes: a pair of substrates that is disposed so as to face each other and be spaced apart from each other; a display medium layer interposed between the substrates; and a plurality of pixels. A plurality of counter signal electrodes, each of which extends in a column direction and through which a data signal is supplied, are formed on one of the substrates. The other substrate includes: a plurality of pixel electrodes arranged in matrix, each said pixel electrode being associated with one of the plurality of pixels; a plurality of pixel switching elements, each of which is connected to associated one of the pixel electrodes; a plurality of gate lines, which extend in a row direction and are used for controlling operations of the pixel switching elements; and a plurality of common lines, each of which is connected to associated ones of the pixel electrodes by way of associated ones of the pixel switching elements. The display device further includes a plurality of signal electrode switching elements, each of which is connected to associated one of the counter signal electrodes and controls supply of the data signal to the counter signal electrode. In this display device, a signal to turn ON the signal electrode switching elements and a signal to turn ON the pixel switching elements have the same polarity.

In this display device, a potential level on one of the common lines (i.e., a common voltage) is applied to one of the pixel electrodes by way of an associated one of the pixel switching elements that has been selected through one of the gate lines. Also, a data signal (e.g., video signal) is written on one of the counter signal electrodes that has been selected by associated one of the signal electrode switching elements. As a result, a voltage, corresponding to a potential difference between the pixel electrode on which the common voltage has been written and the counter signal electrode on which the data signal has been written, is applied to the display medium layer interposed between the pixel and counter signal electrodes. Consequently, an image as represented by the data signal is displayed.

In general, a voltage that has been applied to a display medium layer is held by turning the signal electrode and pixel switching elements from ON into OFF. When these switching elements are turned from ON into OFF, the potential level rises or drops by a predetermined quantity. As a result, direct current components unfavorable for display purposes are generated.

However, in the display device of the second aspect, a signal electrode switching element is connected to each of the counter signal electrodes to control the selected and non-selected (ON and OFF) states thereof. In addition, a pixel switching element is connected to each of the pixel electrodes to control the selected and non-selected states thereof. A signal to turn ON the signal electrode switching element and a signal to turn ON the pixel switching element have the same polarity. This means that when a scan signal is logical one, the signal electrode and pixel switching elements are both turned ON and that when the scan signal is logical zero, these switching elements are both turned OFF, for example. And the variation in potential level when the signal electrode switching element is turned from ON into OFF has the same polarity as the variation in potential level when the pixel switching element is turned from ON into OFF. As for a thin-film transistor, this potential variation corresponds to a feedthrough voltage. As used herein, the phrase "potential variations having the same polarity" means that the potential levels at the counter signal and pixel electrodes both drop or both rise. In the display device according to the second aspect of the present invention, these potential drops or rises can be canceled by each other. The reason is as follows. The counter signal and pixel electrodes are formed on mutually different substrates. Accordingly, if the potential drop (or rise) at the counter signal electrode is almost equal to the potential drop (or rise) at the pixel electrode, the variation in voltage applied to the display medium layer is minimized.

That is to say, if the signal electrode switching element is driven so as to minimize the variation in voltage applied to the display medium layer when the pixel switching element is turned from ON into OFF, then the unfavorable direct current components are further reduced and a voltage at a level even closer to the desired one is applicable to the display medium layer. As a result, it is possible to provide a display device that conducts a display operation just as intended. In addition, there is no need to newly generate a voltage for compensating for the potential drop (or rise) when the switching element is turned from ON into OFF. Consequently, the power dissipation of the display device is further cut down.

Examples of the pixel and signal electrode switching elements include thin-film transistors, MIM elements and varistors.

Furthermore, the signal electrode and pixel switching elements have the same polarity. Accordingly, where the signal electrode and pixel switching elements are formed on the same substrate, these switching elements may be formed through a single manufacturing process. As a result, the manufacturing process is simplified. Consequently, the signal electrode switching elements may be formed in addition to the pixel switching elements without increasing the number of process steps needed or the overall manufacturing cost.

Moreover, since the signal electrode and pixel switching elements may be formed simultaneously, the electrical characteristics of the signal electrode and pixel switching elements are easily equalized with each other. As a result, the drop (or rise) in potential level at the pixel electrode as caused by the pixel switching element and the drop (or rise) in potential level at the counter signal electrode as caused by the signal electrode switching element are substantially equalized with each other more easily.

In a preferred embodiment of the present invention, the display device further includes a plurality of signal electrode transfer sections to ensure electrical connection between each of the signal electrode switching elements and associated one of the counter signal electrodes.

The signal electrode transfer section is a component preferably used to ensure electrical connection between the counter signal electrode and the signal electrode switching element that are formed on mutually different substrates. By using these signal electrode transfer sections, the increase in number of manufacturing process steps needed is reduced as compared to a situation where the signal electrode switching elements and the counter signal electrodes are formed on the same substrate.

Also, as for the pixel electrode and the counter signal electrode, which face each other via the display medium layer, the display device is preferably driven so that an interval, in which one of the pixel switching elements is turned OFF to hold a potential level on associated one of the common lines as written on associated one of the pixel electrodes, overlaps at least partially with an interval, in which one of the signal electrode switching elements is turned OFF to hold a potential level of the data signal as written on associated one of the counter signal electrodes. In that case, in the overlapping interval in which these switching elements are both OFF, the pixel electrode holds a potential level lower than the common line potential by the feedthrough voltage, while the counter signal electrode holds a potential level lower than the data signal potential by the feedthrough voltage. As a result, a desired voltage, from which the potential variation corresponding to the feedthrough voltage has been canceled (and which is approximately equal to a potential difference between the data signal potential and the common line potential), is applied to the display medium layer between the pixel electrode and the counter signal electrode.

In another preferred embodiment of the display device according to the second aspect of the present invention, each said pixel switching element and each said signal electrode switching element may be thin-film transistors that have substantially the same channel length. A ratio of a channel width of each said pixel switching element to an electrostatic capacitance of associated one of the pixels is preferably substantially equal to a ratio of a channel width of each said signal electrode switching element to an electrostatic capacitance of associated one of the counter signal electrodes.

In this structure, the drop (or rise) in potential level at the pixel electrode as caused by the pixel switching element is equalized more accurately with the drop (or rise) in potential level at the counter signal electrode as caused by the signal electrode switching element, and these drops (or rises) cancel each other. As a result, the counter signal electrodes and the common lines have voltage signals with substantially the same DC level, and may be driven by a single power supply, thus avoiding the unwanted situation where an additional voltage should be generated newly. Also, there is no need to try to eliminate a variation in potential drop (or rise) among respective cells. Consequently, the number of parts and trouble needed for fine adjustment is saved, thus cutting down the overall manufacturing cost.

In still another preferred embodiment of the display device according to the second aspect of the present invention, each said pixel switching element and each said signal electrode switching element may be thin-film transistors, which have channels extending substantially in parallel with each other.

In this structure, even if a pattern shift or misalignment has occurred during the manufacturing process of the display device, the drop (or rise) in potential level at the pixel electrode as caused by the pixel switching element is substantially equalized with the drop (or rise) in potential level at the counter signal electrode as caused by the signal electrode switching element, and these drops (or rises) cancel each other. As a result, the counter signal electrodes and the common lines have voltage signals with substantially the same DC level, and may be driven by a single power supply, thus avoiding the unwanted situation where an additional voltage should be generated newly. Also, there is no need to try to eliminate a variation in potential drop (or rise) among respective cells. Consequently, the number of parts and trouble needed for fine adjustment is saved, thus cutting down the overall manufacturing cost.

In yet another preferred embodiment, each said pixel switching element and each said signal electrode switching element may be both n-channel transistors.

Alternatively, each said pixel switching element and each said signal electrode switching element may be both p-channel transistors.

In yet another preferred embodiment, the display medium layer may be a liquid crystal layer.

A driving method according to the second aspect of the present invention is adapted to drive a display device that includes: a pair of substrates that is disposed so as to face each other and be spaced apart from each other; and a display medium layer interposed between the substrates. A plurality of counter signal electrodes, each of which extends in a column direction and through which a data signal is supplied, are formed on one of the substrates. The other substrate includes: a plurality of pixel electrodes arranged in matrix; a plurality of pixel switching elements, each of which is connected to associated one of the pixel electrodes; a plurality of gate lines, which extend in a row direction and are used for controlling operations of the pixel switching elements; and a plurality of common lines, each of which is connected to associated ones of the pixel electrodes by way of associated ones of the pixel switching elements. The display device further includes a plurality of signal electrode switching elements, each of which is connected to associated one of the counter signal electrodes and controls supply of the data signal to the counter signal electrode. This method is characterized by driving the display device in such a manner that an interval, in which one of the pixel switching elements is turned OFF to hold a potential level on associated one of the common lines as written on associated one of the pixel electrodes, overlaps at least partially with an interval, in which one of the signal electrode switching elements is turned OFF to hold a potential level of the data signal as written on associated one of the counter signal electrodes, for the pixel electrode and the counter signal electrode that face each other via the display medium layer.

According to this method, the drop (or rise) in potential level at the counter signal electrode as caused by the signal electrode switching element and the drop (or rise) in potential level at the pixel electrode as caused by the pixel switching element cancel each other. As a result, the unfavorable direct current components are further reduced and a voltage at a level even closer to the desired one is applicable to the display medium layer.

A display device according to a third aspect of the present invention includes: a pair of substrates that is disposed so as to face each other and be spaced apart from each other; and a display medium layer interposed between the substrates. A plurality of counter signal electrodes, each of which extends in a column direction and through which a data signal is supplied, are formed on one of the substrates. The other substrate includes: a plurality of pixel electrodes arranged in matrix; a plurality of pixel switching elements, each of which is connected to associated one of the pixel electrodes; a plurality of gate lines, which extend in a row direction and are used for controlling operations of the pixel switching elements; and a plurality of common lines, each of which is connected to associated ones of the pixel electrodes by way of associated ones of the pixel switching elements. The display device further includes a plurality of signal electrode switching elements, each of which is connected to associated one of the counter signal electrodes and controls supply of the data signal to the counter signal electrode.

In this display device, the counter signal electrodes and the gate lines are formed on mutually different substrates. Accordingly, the capacitance of the counter signal electrodes decreases and the load on the driver is reduced. In addition, short-circuit failures, which would otherwise occur at intersections between the counter signal electrodes and the gate lines, are eliminated. Furthermore, this display device includes the signal electrode switching elements, each of which is connected to associated one of the counter signal electrodes and controls supply of the data signal to the counter signal electrode. Thus, the number of external drivers needed is reduced. As a result, the drivers may be mounted along one side.

Furthermore, if signal electrode and pixel switching elements having the same polarity are used for this display device, then the display device according to the second aspect of the present invention may be formed.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the accompanying drawings. In the following detailed description of preferred embodiments, f first through f fourth embodiments will relate to an active matrix substrate according to a first aspect of the present invention and a display device including the active matrix substrate. On the other hand, a fifth embodiment to be described later will relate to a display device according to a second aspect of the present invention.

Embodiment 1

Figure 1:
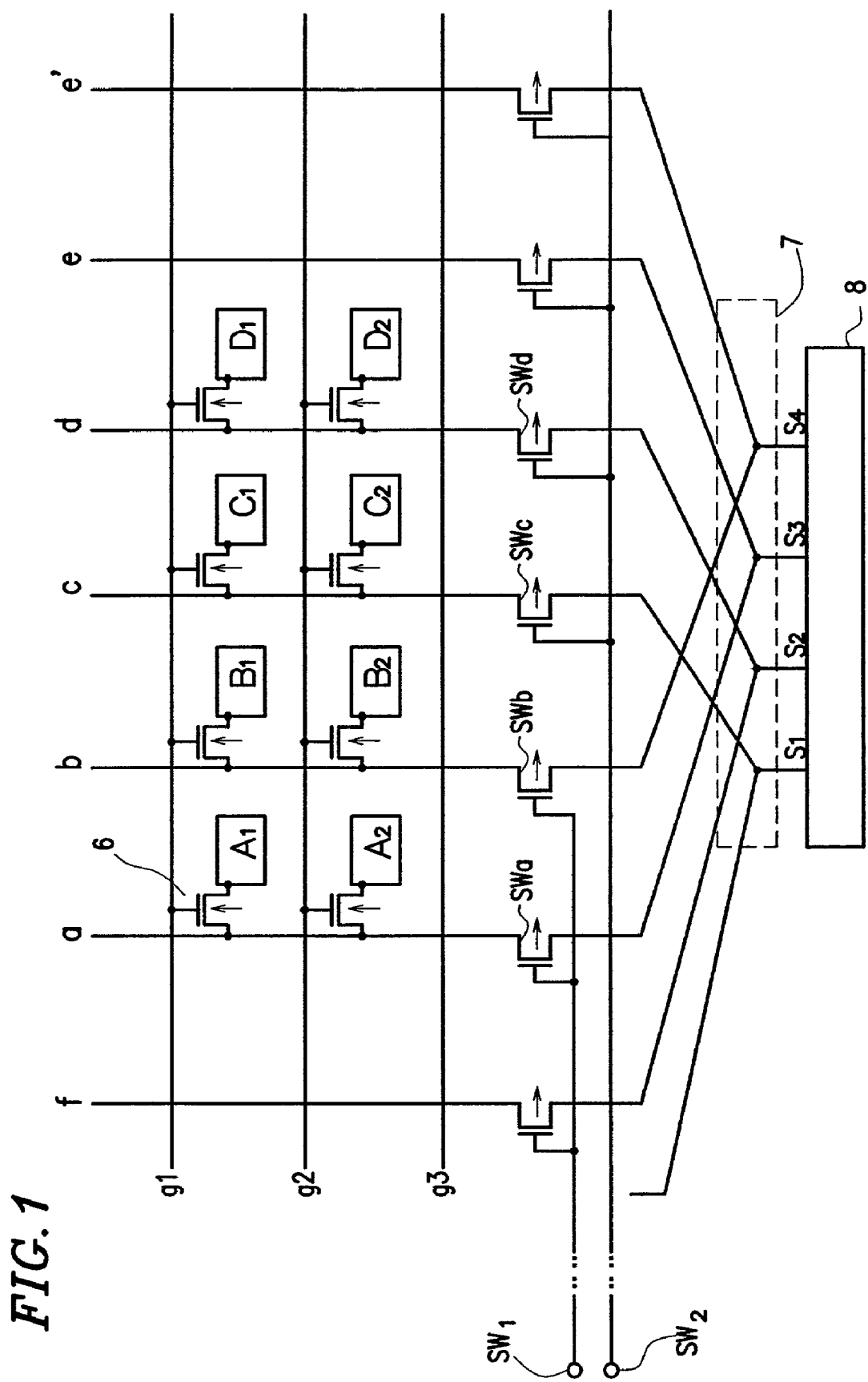
FIG. 1 illustrates an equivalent circuit of a liquid crystal display device including an active matrix substrate according to a first aspect of the present invention.
Figure 2:
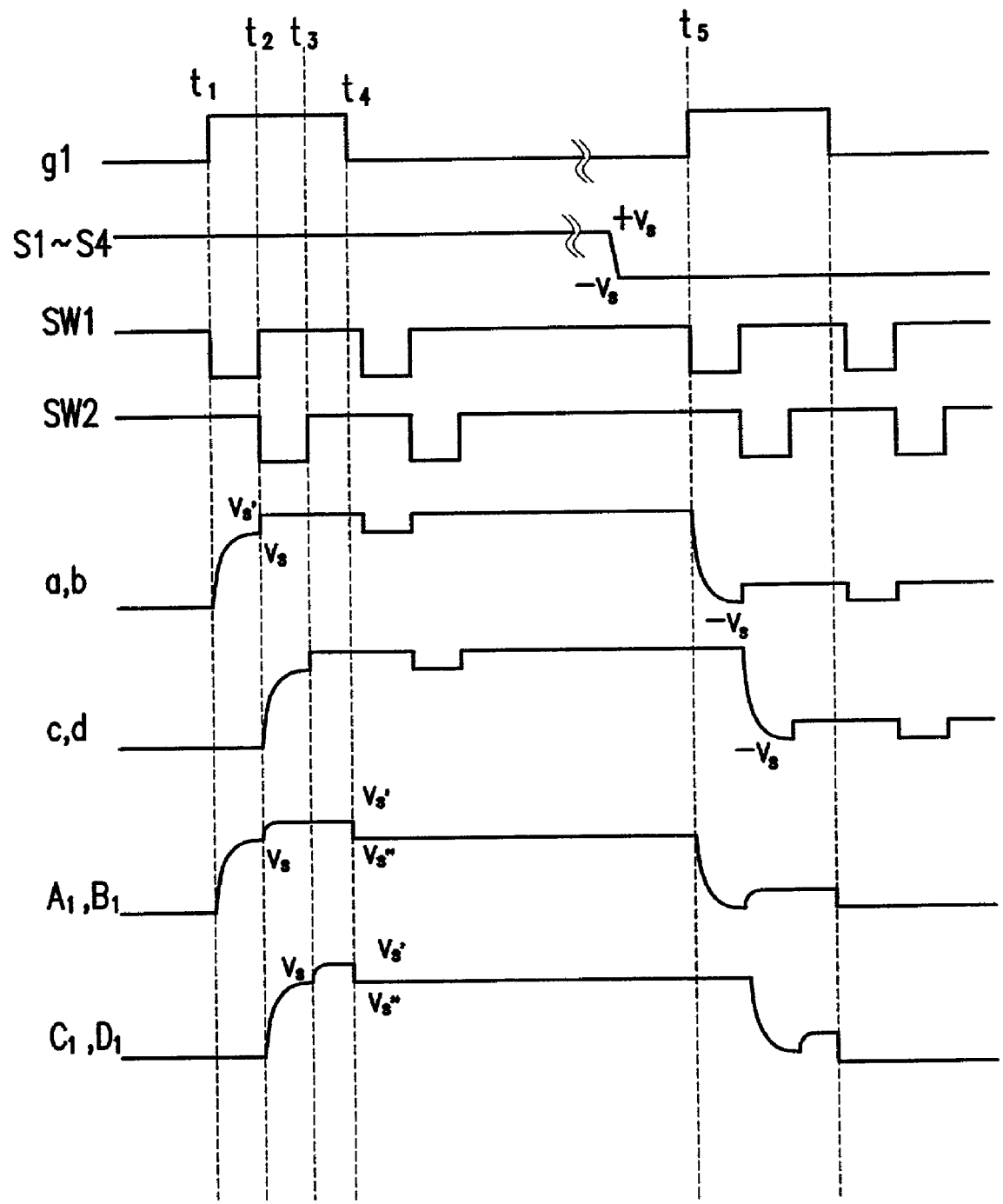
FIG. 2 is a waveform chart illustrating how the liquid crystal display device shown in FIG. 1 may be driven.

FIG. 1 illustrates an equivalent circuit of a liquid crystal display device including an active matrix substrate according to a first specific preferred embodiment of the present invention. In this preferred embodiment, the data lines are grouped into two blocks. FIG. 2 is a waveform chart illustrating how the liquid crystal display device shown in FIG. 1 may be driven.

As shown in FIG. 1, the active matrix substrate of this preferred embodiment includes, on a transparent insulating preferred embodiment includes, on a transparent insulating substrate of glass, plastic or other suitable material: pixel electrodes A1, A2, B1, B2, C1, C2, D1, D2, etc.; pixel switching elements 6; gate lines (scanning lines) g1, g2, g3, etc.; and data lines a, b, a, d, e, f, etc. Each of the pixel switching elements 6 is connected to associated one of the pixel electrodes A1, A2, B1, B2, C1, C2, D1, D2, etc. The gate lines g1, g2, g3, etc. are used to control the operations of the pixel switching elements 6. Each of the data lines a, b, c, d, e, f, etc. is connected to associated ones of the pixel electrodes A1, A2, B1, B2, C1, C2, D1, D2, etc. by way of associated ones of the pixel switching elements 6 and allows a data signal to pass therethrough.

On the active matrix substrate of this embodiment, data line switching elements SWa, SWb, SWc, SWd, etc., signal input terminals S1, S2, S3 S4, etc., data line branching section 7 and control lines SW1 and SW2 are provided. Each of the data line switching elements SWa, SWb, SWe, SWd, etc. has one of its terminals connected to associated one of the data lines a, b, c, d, e, f, etc. Each of the signal input terminals S1, S2, S3 S4, etc. is electrically connected to another terminal at associated ones of the data line switching elements SWa, SWb, SWc, SWd, etc. The signal input terminals S1, S2, S3 S4, etc. are the output terminals of a data line driver 8. The data line branching section 7 is provided between the signal input terminals S1, S2, S3 S4, etc. and the data line switching elements SWa, SWb, SWc, SWd, etc. Each of the control lines SW1 and SW2 is connected in common to associated ones of the data line switching elements SWa, SWb, SWc, SWd, etc. to selectively turn ON or OFF the associated data line switching elements SWa, SWb, SWc, SWd, etc.

This preferred embodiment is characterized in that a signal to turn ON the data line switching elements SWa, SWb, SWc, SWd, etc. and a signal to turn ON the pixel switching elements 6 have mutually different polarities. More specifically, each of the pixel switching elements 6 is implementable as an n-channel MOS transistor. Accordingly, a signal to be applied to the gating portion (i.e., the gate electrode) of each of these pixel switching elements 6 to turn the pixel switching element 6 ON should have a logically high level. On the other hand, each of the data line switching elements SWa, SWb, SWC, SWd, etc. of this preferred embodiment is implementable as a p-channel MOS transistor. Accordingly, a signal to be applied to the gating portion (i.e., the gate electrode) of each of these data line switching elements SWa, SWb, SWc, SWd, etc. to turn the data line switching element SWa, SWb, SWO, SWd, etc. ON should have a logically low level.

In this manner, a signal that should turn ON one of the data line switching elements SWa, SWb, SWc, SWd, etc. and a signal that should turn ON one of the pixel switching elements 6 have mutually different polarities in accordance with this preferred embodiment. Accordingly, even when the potential level on any of the data lines a, b, a, d, e, f, etc. is raised (or dropped) by one of the data line switching elements SWa, SWb, SWc, SWd, etc., the potential level at the associated pixel electrodes A1, A2, B1, B2, C1, C2, D1, D2, etc. is dropped (or raised) by the associated pixel switching elements 6 as will be detailed later. That is to say, the potential rise caused by one of these two types of switching elements is canceled by the potential drop caused by the other type of switching elements. In this manner, one of the problems of the prior art mentioned in the background of the invention is solved.

Hereinafter, a manufacturing process of an active matrix substrate according to this preferred embodiment will be described.

First, the gate lines g1, g2, g3, etc. and gate electrodes and storage capacitor lines (not shown) for transistors are formed on an insulating substrate (not shown). In this process step, the control lines SW1 and SW2 for the data line switching elements SWa, SWb, SWc, SWd, etc. are also formed simultaneously.

Next, known manufacturing process steps are performed to form gate insulating film, semiconductor layer (e.g., polysilicon layer) and source/drain contact layer (none of which is shown) and thereby form pixel transistors that will be used as the pixel switching elements 6. At this time, data line transistors that will be used as the data line switching elements SWa, SWb, SWa, SWd, etc. are also formed. Then, the semiconductor layer is activated by subjecting the layer to an annealing process for dehydrogenation or a laser annealing process. In this preferred embodiment, the source/drain regions of each n-channel pixel transistor 6 are doped with phosphorus, while the source/drain regions of each p-channel data line transistor SWa, SWb, SWc, SWd, etc. are doped with boron.

Next, parts of the gate insulating film are etched away by a photolithographic process to make electrical contact between lines or electrodes and the source/drain regions. A metal film is deposited and then patterned into the shape of the data lines a, b, c, d, e, f, etc. At this time, pads for mounting the data line driver 8 thereon and the data line branching section 7 are also formed. The pixel electrodes A1, A2, B1, B2, C1, C2, D1, D2, etc. are made of a transparent conductive film of ITO, for example.

To make a liquid crystal display device using this active matrix substrate, first, while the active matrix substrate is being fabricated, a counter substrate is prepared. The counter substrate may be prepared by forming color filters, a black matrix, etc. on an insulating substrate of glass, for example. A counter electrode to be formed on the counter substrate may be made of a transparent conductive film of ITO, for example.

Next, the active matrix substrate is coated with a sealing agent (not shown) with opening formed in part of the resultant sealing member. The counter substrate is coated with a conductive material for transferring a signal to the counter electrode. Then, after spacers (not shown) have been dispersed to make a liquid crystal layer, which will be used as a display medium layer, have a constant thickness, these substrates are bonded together and the sealing agent is cured by heating it. Thereafter, a liquid crystal material is injected through the openings. Finally, the openings are closed with an end-sealing material (not shown), thereby completing a display panel for a liquid crystal display device.

Next, it will be described with reference to FIG. 2 how the active matrix substrate of this preferred embodiment may be driven. In the following illustrative example, a signal (+VS, −VS) with the maximum amplitude is supposed to be supplied through the output terminals S1 through S4 of the data line driver 8 to conduct a black display on the entire screen.

While the gate line g1 is being selected, signals are alternately sent through the control lines SW1 and SW2 to turn ON the data line switching elements SWa, SWb, SWc, SWd, etc. First, at a time t1, the gate line g1 is activated, thereby turning ON the pixel transistors (i.e., n-channel TFTs) 6 connected to the gate line g1. At the same time t1, the control line SW1 is deactivated, thereby turning ON the data line switching elements (i.e., p-channel TFTs) SWa and SWb. As a result, a data signal (+VS) is supplied from the data line driver 8 to the data lines a and b. Since the gate line g1 is now selected, the potential (+VS) is written on the pixel electrodes A1 and B1 in the meantime. On the other hand, since the other control line SW2 is not selected in this interval, no signal is supplied to the data lines c and d.

Accordingly, the zero potential level on the data lines c and d is written on the pixel electrodes C1 and D1.

Next, at a time t2, the control line SW1 is activated to turn OFF the data line switching elements SWa and SWb. Thus, the potential level on the data lines a and b is held. However, the instant these data line switching elements SWa and SWb change from the selected state into the non-selected state, the potential level on these data lines a and b is raised by −ΔVgd due to the parasitic capacitance created by the data line switching elements SWa and SWb. As a result, the data lines a and b come to have a potential level of +VS' higher than +VS by −ΔVgd. At the same time t2, the control line SW2 is deactivated to turn the data line switching elements SWc and SWd ON. Thus, the data signal (+VS) is supplied from the data line driver 8 to the data lines c and d, and the potential level (+VS) is written onto the pixel electrodes C1 and D1.

Next, at a time t3, the control line SW2 is activated to turn the data line switching elements SWc and SWd OFF. Then, the potential level on the data lines c and d is also raised by −ΔVgd to +VS' just like the potential level on the data lines a and b. Since the pixel switching elements 6 will be kept ON until a time t4, +VS' will be written on the pixel electrodes A1, B1, C1 and D1.

And when the gate line g1 is deactivated at the time t4, the pixel switching elements 6 in the ON state are turned OFF. In this case, when these switching elements 6 change from the ON state into the OFF state, the potential level at the pixel electrodes A1, B1, C1 and D1 drops by −ΔVsw due to the parasitic capacitance of the pixel switching elements 6. As a result, the pixel electrodes A1, B1, C1 and D1 come to have a potential level of +VS" lower than +VS' by −ΔVsw. Accordingly, in an interval between the time t4 at which the pixel switching elements 6 are turned OFF to fix the voltage retained in the liquid crystal layer and a next write timing t5, a voltage of VS"−VC (where VC is a common voltage applied to the counter electrode) is applied to the liquid crystal layer.

Supposing the potential rise of −ΔVgd (corresponding to a potential drop of ΔVgd) caused by the data line switching elements SWa, SWb, SWO and SWd is given by $$VS-VS'=\Delta Vgd$$

while the potential drop of ΔVsw caused by the pixel transistors 6 is given by $$VS''-VS'=\Delta Vsw$$

a voltage given by $$VS''-VC=VS-VC+\Delta Vsw-\Delta Vgd$$

is applied to the liquid crystal layer during the retention interval. It should be noted that the signs of ΔVgd and ΔVsw are both negative (i.e., ΔVgd, ΔVsw<0). Accordingly, "to raise a potential level by −ΔVgd" is equivalent to "to drop the potential level by ΔVgd", and "to drop a potential level by −ΔVsw" is equivalent to "to raise the potential level by ΔVsw".

According to a similar calculation, in the next frame in which a negative potential is written and which starts at the time t5, a voltage given by $$-VS+VC+\Delta Vsw-\Delta Vgd$$

is applied to the liquid crystal layer. That is to say, a voltage that has been offset from the originally intended voltage by ΔVsw−ΔVgd is applied to the liquid crystal layer. Accordingly, it is necessary to prevent a DC voltage from being applied to the liquid crystal layer by superposing the DC value corresponding to this offset on the potential level on the data lines or at the counter electrode using, for example, a circuit for regulating the counter voltage level. Stated otherwise, if the active matrix substrate is designed in such a manner that $\Delta Vsw = \Delta Vgd$ and if a desired product is obtained just as designed, there is no need to superpose the DC voltage to compensate for the offset. In that ideal case, the DC value of the counter electrode is equal to that of the data lines. That is to say, a voltage range of a power supply prepared for the data lines should fall within a voltage range of a power supply prepared for the counter electrode, and vice versa. Accordingly, there is no need to generate two different voltages separately, thus reducing the power dissipation advantageously. Also, even if $\Delta Vsw$ is not equal to $\Delta Vgd$, the inventive structure minimizes the offset as compared to the conventional structure in which the two sets of switching elements have the same channel type. This is because in the conventional structure, the drop in potential level at the pixel electrode as caused by one of the pixel switching elements has the same polarity as the drop in potential level at the pixel electrode as caused by one of the data line switching elements. Accordingly, in the conventional structure, the sum of these potential drops (i.e., $\Delta Vsw + \Delta Vgd$) is the offset.

It should be noted that $\Delta Vgd$ and $\Delta Vsw$ are normally given by $$|\Delta Vgd| = Cgd/Cpix \times Vgpp$$

$$|\Delta Vsw| = Csws/Cs \times Vswpp$$

where Cgd is a parasitic capacitance formed between the gate electrode of a pixel switching element and its associated pixel;

Cpix is a total capacitance of the pixel;

Vgpp is a voltage difference of a signal on a gate line between the logical one and logical zero states thereof;

Csws is a parasitic capacitance formed between the gate electrode of a data line switching element and its associated data line;

Cs is a total capacitance of the data line; and

Vswpp is a voltage difference of a signal on the control line between the logical one and logical zero states thereof.

If the thickness of the gate insulating film on the substrate or the gate width or the gate-drain overlap of the transistors has changed due to some variation in a manufacturing process condition, then Cgd or Csws changes greatly. It is impossible to completely eliminate these variations from the actual manufacturing process. Accordingly, in the prior art, the DC level of the counter electrode should be adjusted for each display panel.

In contrast, in the liquid crystal display device of this preferred embodiment, if $\Delta Vsw = \Delta Vgd$, no DC voltage is applied to the pixels. Thus, there is no need to adjust the DC level of the counter electrode unlike the prior art. Generally speaking, the voltage level on the gate lines g1 and g2 is often equal to the voltage level on the control lines SW1 and SW2. This is because these voltage levels are often a unique value determined for each specific device to drive a switching element made of amorphous silicon, for example. Accordingly, Vgpp and Vswpp may normally be regarded as equal to each other. Thus, to satisfy $\Delta Vsw = \Delta Vgd$, Cgd/Cpix should be equal to Csws/Cs.

Suppose the p- and n-channel transistors have the same carrier mobility (field effect mobility). In that case, if the transistors are designed in such a manner as to minimize Cgd and Csws by adopting the minimum permissible rule of the manufacturing process as the channel length of the transistors, then the ability to apply a predetermined voltage to the data lines or the pixel electrodes, i.e., chargeability, is defined as a ratio of the channel width of the transistors to the load capacitance.

If the channel width/load capacitance ratios of the data line and pixel switching elements are substantially equalized with each other, then the parasitic capacitance/load capacitance ratios thereof will also be equal to each other. That is to say, Cgd/Cpix and Csws/Cs become equal to each other.

The data line and pixel switching elements have almost the same structure except that the channel widths of these two types of switching elements are different from each other. Accordingly, the variation in thickness of the gate insulating film or in direction or length of the pattern shift is equally observed in both of these two types of switching elements. Thus, these two types of switching elements are equally affected by the variation. That is to say, even if any process parameter has changed, the relationship Cgd/Cpix=Csws/Cs is maintained. As a result, $\Delta Vsw = \Delta Vgd$ is still satisfied.

On the other hand, even if the p- and n-channel transistors have mutually different carrier mobilities, the ratio of the channel width of the data line switching element to the data line capacitance and the ratio of the channel width of the pixel switching element to the pixel capacitance should have their respective constant values to achieve almost the same effects as those described above. If the p- and n-channel transistors have mutually different carrier mobilities, the transistor of one of these two channel types should have a chargeability superior to that of the transistor of the other channel type. In that case, the transistor with the higher chargeability should be allocated to either the pixel electrode or the data line that needs to have the higher chargeability.

Furthermore, the pixel and data line switching elements preferably have the same channel length direction. The reason is as follows. Specifically, in that case, even if a pattern shift or misalignment has occurred in a particular direction during the manufacturing process, the drop in potential level at the pixel electrode as caused by the pixel switching element is substantially equal to the drop in potential level on the data line as caused by the data line switching element. As a result, the above-described effects are maintained. That is to say, Cgd/Cpix=Csws/Cs is still satisfied and the DC levels of the data line and the counter electrode are not different from each other. Hereinafter, this point will be described in further detail with reference to FIGS. 3A and 3B.

Figure 3A:
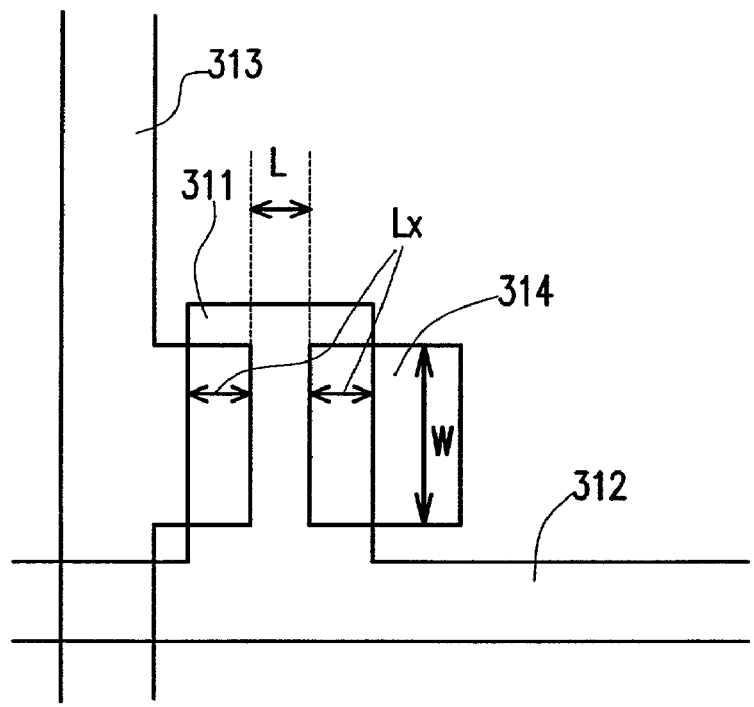
FIG. 3A and 3B illustrate a situation where a pattern shift has occurred during the manufacturing process of the active matrix substrate according to the first aspect of the present invention.
Figure 3B:
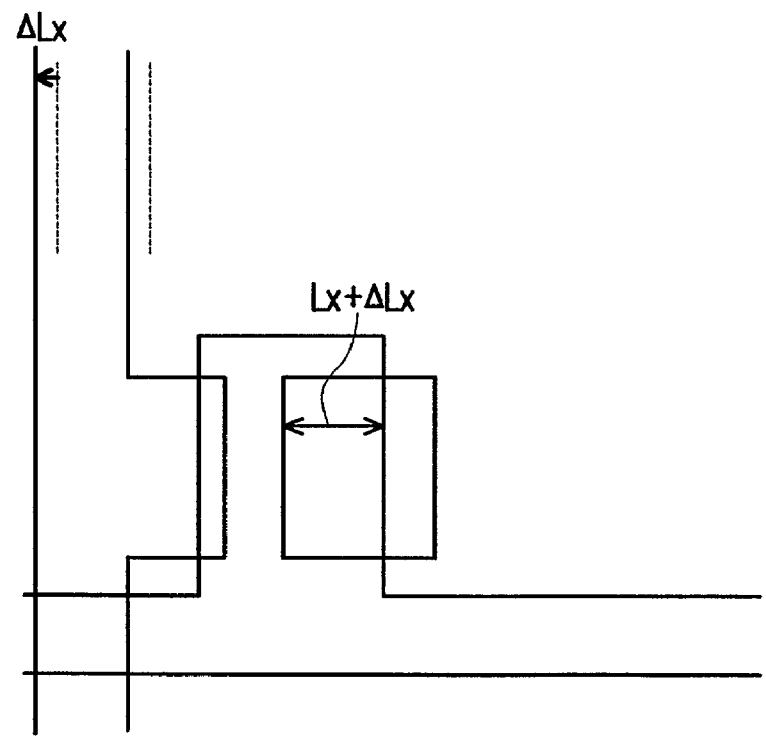

FIGS. 3A and 3B are plan views illustrating a pixel switching element and its surrounding members. In FIGS. 3A and 3B, a parasitic capacitance Cgd formed between the gate electrode 311 of a thin-film transistor as the pixel switching element and a pixel electrode 314 is determined by the overlap area between the pixel electrode 314 and the gate electrode 311. As shown in FIGS. 3A and 3B, the gate electrode 311 extends from a gate line 312, while the pixel electrode 314 extends from a data line 313. It should be noted, however, that $\Delta Vgd$ is generated the instant the transistor turns from ON into OFF. Thus, portions of its channel also act as part of the electrode and the virtual length of the overlap portion should be regarded as longer than the actual length Lx of the area in which the gate electrode 311 overlaps with the pixel electrode 314. That is to say, the length of the overlap portion virtually extends in the channel length direction. The present inventors actually measured the extension via experiments and discovered that the area contributing to forming the parasitic capacitance Cgd is approximately equal to W×(Lx+L/2). If the data line pattern 313 has shifted in the channel length direction by ΔLx with respect to the gate line 312 as shown in FIG. 3B, then the area contributing to forming the parasitic capacitance Cgd increases to about W×(Lx+ΔLx+L/2), which is (1+ΔLx/(Lx+L/2))–time greater than the original area. That is to say, ΔVgd also increases by a factor of 1+ΔLx/(Lx+L/2).

As described above, L is set equal to the minimum permissible rule of the manufacturing process and Lx is a constant value that is so defined as not to exceed the length of the gate electrode even if the shift reaches the maximum possible value for the manufacturing process. Accordingly, L and Lx are constant for both pixel and data line switching elements alike. Thus, if the pixel and data line switching elements have the same channel length direction, then ΔVgd and ΔVsw both increase at the same rate with ΔLx. As a result, ΔVgd=ΔVsw is maintained.

As described above, according to this preferred embodiment, the rise or drop in potential level as caused by the pixel switching element is canceled by the drop or rise in potential level as caused by the data line switching element thus making it possible to drive the display device with reduced power dissipation. By using an active matrix substrate like this, a display device that conducts a display operation good enough to apply to display panels of various types is realized by a smaller number of components.

In the preferred embodiment described above, each data line switching element is implemented as a single transistor (e.g., a thin-film transistor). Alternatively, each data line switching element may be a switching circuit including a plurality of transistors.

Also, in the preferred embodiment described above, an active matrix substrate is fabricated using an insulating substrate. However, an active matrix substrate according to the first aspect of the present invention is not limited thereto, but is applicable to a semiconductor substrate of silicon, for example.

Embodiment 2

In the first specific embodiment described above, the driver is implemented as an external driver IC. However, an active matrix substrate according to the first aspect of the present invention is also applicable to a situation where a gate line driver and/or a data line driver are/is integrated monolithically with the other components on the same substrate.

Hereinafter, a second specific preferred embodiment of the present invention, in which a driver is formed monolithically on a substrate, will be described with reference to FIG. 4.

Figure 4:
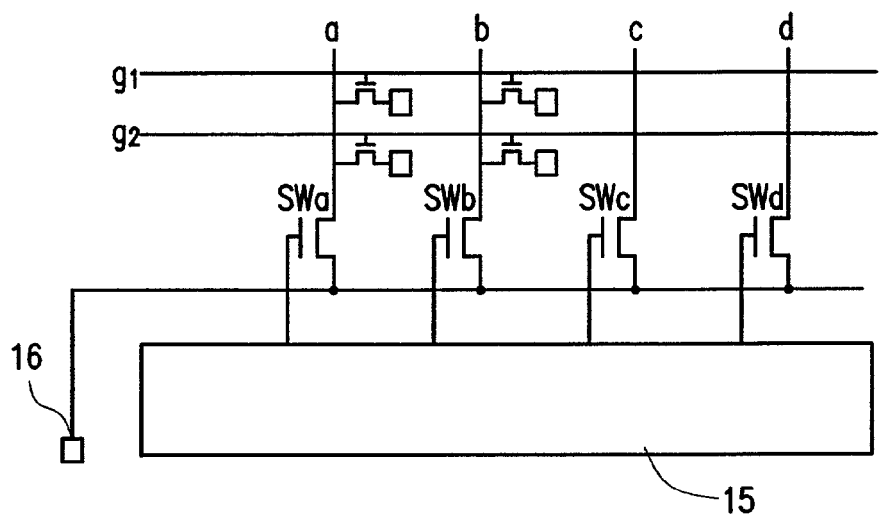
FIG. 4 illustrates an exemplary monolithic driver.

FIG. 4 is a circuit diagram illustrating a configuration for a typical analog driver. In the embodiment illustrated in FIG. 4, a plurality of data line switching elements SWa, SWb, SWa and SWd, a signal input terminal 16 and a data line branching section are formed on the same substrate. Each of the data line switching elements SWa, SWb, SWc and SWd has one of its terminals connected to associated one of data lines and another terminal thereof connected in common to the signal input terminal 16. The data line branching section is provided between the signal input terminal 16 and the switching elements SWa, SWb, SWc and SWd.

Control lines, which are connected to the data line switching elements SWa, SWb, SWc and SWd to selectively turn ON or OFF the switching elements SWa, SWb, SWc and SWd, are connected to a shift register 15.

Also, as in the first specific embodiment of the present invention, the channel type of the data line switching elements SWa, SWb, SWc and SWd is opposite to that of the pixel switching elements so that a signal to turn ON the data line switching elements SWa, SWb, SWc and SWd and a signal to turn ON the pixel switching elements have mutually different polarities.

In a driver like this, a signal is sequentially supplied from the signal input terminal 16 and then delivered to one of the data lines after another to be selected by the switching elements SWa, SWb, SWc and SWd. That is to say, while the data line switching elements SWa, SWb, SWc and SWd are sequentially selected one after another responsive to a select signal generated by the shift register 15, a video signal is sequentially supplied through the signal input terminal 16 onto one of the data lines a, b, c and d after another via the switching elements SWa, SWb, SWc and SWd. This operation will be continued until a predetermined number of pixels on one gate line have been driven. In the meantime, the gate line is selected. Accordingly, the signal is supplied to those pixels by a point sequential addressing technique.

The potential levels are also raised or dropped when the switching elements turn ON or OFF. However, as in the first embodiment, two groups of transistors of mutually opposite channel types are used as two sets of switching elements. Thus, the same effects and advantages as those of the first embodiment are also achievable by this second specific embodiment.

It should be noted that the driver does not have to have the monolithic structure shown in FIG. 4 but may be implementable as a driver IC. In the conventional driver IC, however, the transistors fabricated by a known silicon process have good electrical characteristics. Accordingly, the switching elements on the last stage are easily downsized and the potential rise or drop caused by the switching elements is almost non-negligible. For that reason, if the circuit shown in FIG. 4 is formed using a driver IC, there is not so much need to adopt this second specific embodiment. On the other hand, where a monolithic driver is used, the transistors should be fabricated on the substrate by a thin film process. Thus, each of those switching elements has small carrier mobility and is hard to downsize if sufficiently high patterning precision is required. In that case, the potential rise or drop at the pixel electrodes is non-negligible. Accordingly, the second specific embodiment is applicable particularly effectively to the situation where a monolithic driver is used.

Embodiment 3

Figure 5:
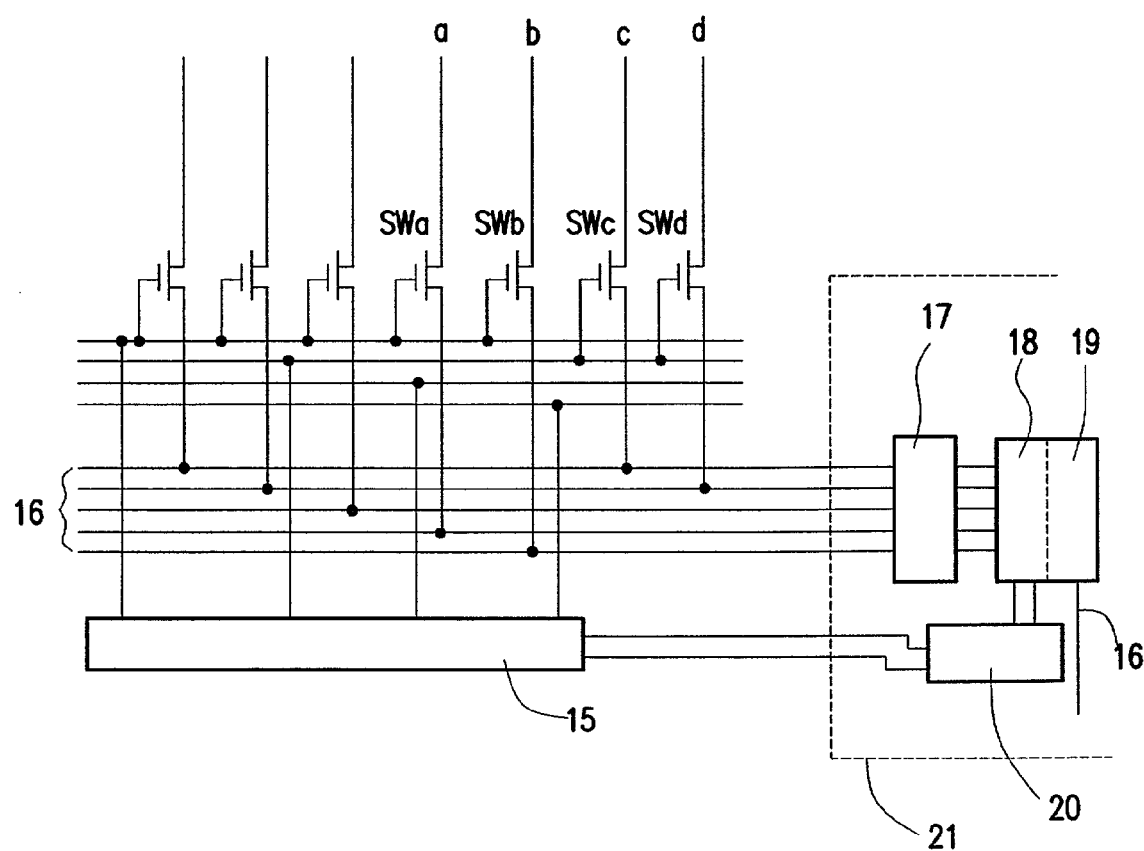
FIG. 5 illustrates an exemplary partially monolithic driver.

Hereinafter, a third specific preferred embodiment of the present invention, in which part of the driver has a monolithic structure, will be described with reference to FIG. 5. In the example illustrated in FIG. 4, the data lines are driven by the fully monolithic driver. Accordingly, required specifications may not be satisfied in respects of operating speed and signal accuracy. On the other hand, in the embodiment illustrated in FIG. 5, data line switching elements SWa, SWb, SWc and SWd, which are selected on a block-by-block basis, and a shift register 15 for generating and supplying a control signal for these data line switching elements SWa, SWb, SWc and SWd, are formed on the same substrate. In addition, shift register 19 operating at a higher speed, sample and hold circuit 18, D/A converter 17 and controller 20 for generating a clock signal or a start pulse are implemented as an external driver 21.

In this manner, the driver of this third specific embodiment includes both an external driver IC and a monolithic driver section. That is to say, this driver is intermediate between the external driver and the monolithic driver.

In a structure like this, part of the driver has a monolithic structure. Accordingly, a CMOS process is normally used to form such a structure. For that reason, even if one group of switching elements (i.e., data line switching elements or pixel switching elements) are formed as n-channel transistors and the other group of switching elements are formed as p-channel transistors by adopting the basic concept of the present invention, the number of manufacturing process steps needed does not increase so much.

Embodiment 4

Hereinafter, a fourth specific preferred embodiment of an active matrix substrate according to the first aspect of the present invention will be described with reference to FIGS. 6A and 6B.

In the embodiment illustrated in FIG. 4, the pixels are driven by a point sequential addressing technique. However, a so-called "line sequential addressing methods" is also used extensively as an alternative to the point sequential addressing technique so as to reduce the difference in display quality resulting from a time lag between a point in time the leftmost pixel is driven and a point in time the rightmost pixel is driven on the same screen and to utilize a time for writing data onto a pixel electrode more effectively. In the line sequential addressing method, while a gate line is selected, signal charges are supplied simultaneously to all the pixel electrodes associated with the gate line.

Figure 6A:
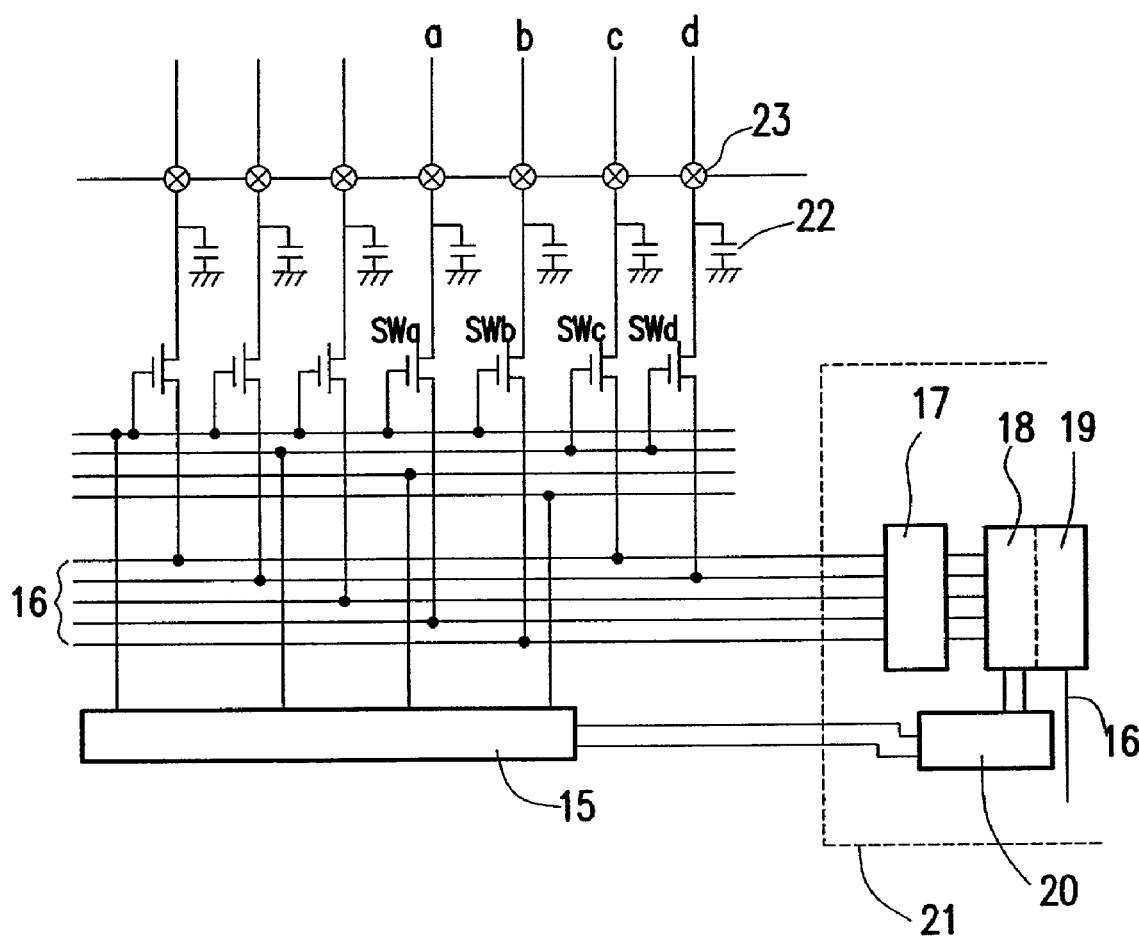
FIGS. 6A and 6B illustrate another exemplary partially monolithic driver.
Figure 6B:
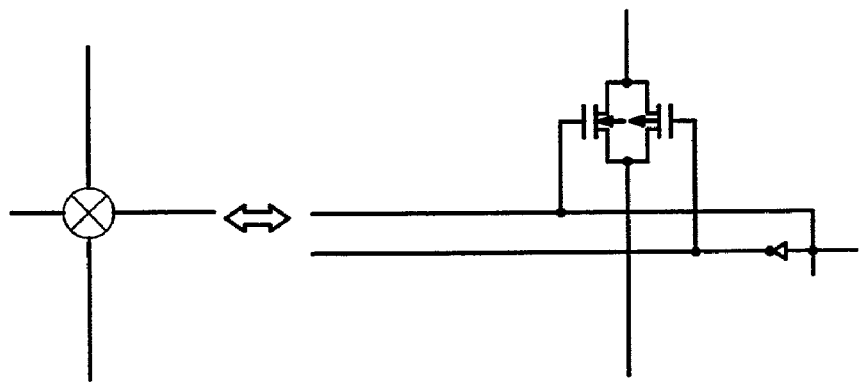

The line sequential addressing is carried out on the driver shown in FIG. 6A. In the driver shown in FIG. 6A, data is temporarily stored on data storage capacitors 22 and then switching elements (or switches) 23 are turned ON at a time, thereby supplying a signal onto a plurality of data lines simultaneously. Each of these switching elements 23 may be a CMOS circuit having a structure such as that shown on the right-hand side of FIG. 6B. Specifically, the CMOS circuit is formed of a circuit component, in which p- and n-channel transistors are connected in parallel to each other, as a unit. Control signals with mutually opposite polarities are input to these transistors, thereby turning one of these transistors ON and the other transistor OFF at the same time. Accordingly, the potential rise and drop, caused just after these transistors have been switched, are canceled.

In this specific embodiment, the potential rise and drop caused by the pixel switching elements and data line switching elements should have mutually opposite polarities. In addition, every time a pixel is written, the potential rise and drop should be canceled by each other. Accordingly, each of the switching elements 23 shown in FIG. 6A is preferably an n- or p-channel transistor or a CMOS circuit exhibiting an asymmetric characteristic. Suppose each of the pixel switching elements is an n-channel transistor and each of the data line switching elements 23 is a CMOS circuit having an asymmetric characteristic. In that case, in the CMOS circuit, the p-channel transistor should have a channel width or channel length sufficiently greater than that of the n-channel transistor.

Embodiment 5

Hereinafter, a display device according to a second aspect of the present invention will be described as a fifth specific preferred embodiment of the present invention.

In the display device according to the second aspect of the present invention, so-called "data lines", through which a data signal is supplied, are formed on a counter substrate, which is prepared separately from a substrate including gate lines, pixel electrodes, and so on thereon. Also, these "data lines" are disposed so as to face the pixel electrodes so that the liquid crystal layer is driven by a potential difference created between a voltage applied to the "data lines" and a voltage applied to the pixel electrodes. For this reason, the "data lines" will be herein referred to as "counter signal electrodes" to make their function more easily understandable.

In the exemplary liquid crystal display device to be described below, switching elements of the type dropping the potential level of the liquid crystal layer when turned ON or OFF are used as pixel switching elements and signal electrode switching elements. However, the display device of the second aspect is not limited to this particular embodiment. The display device of the second aspect is partly characterized by using switching elements of the same polarity as the pixel switching elements and signal electrode switching elements. Accordingly, switching elements of the type raising the potential level of the liquid crystal layer when turned ON or OFF may also be used as the pixel switching elements and signal electrode switching elements. For example, both the pixel switching elements and signal electrode switching elements may be n-channel transistors. Alternatively, both the pixel switching elements and signal electrode switching elements may be p-channel transistors.

Figure 8:
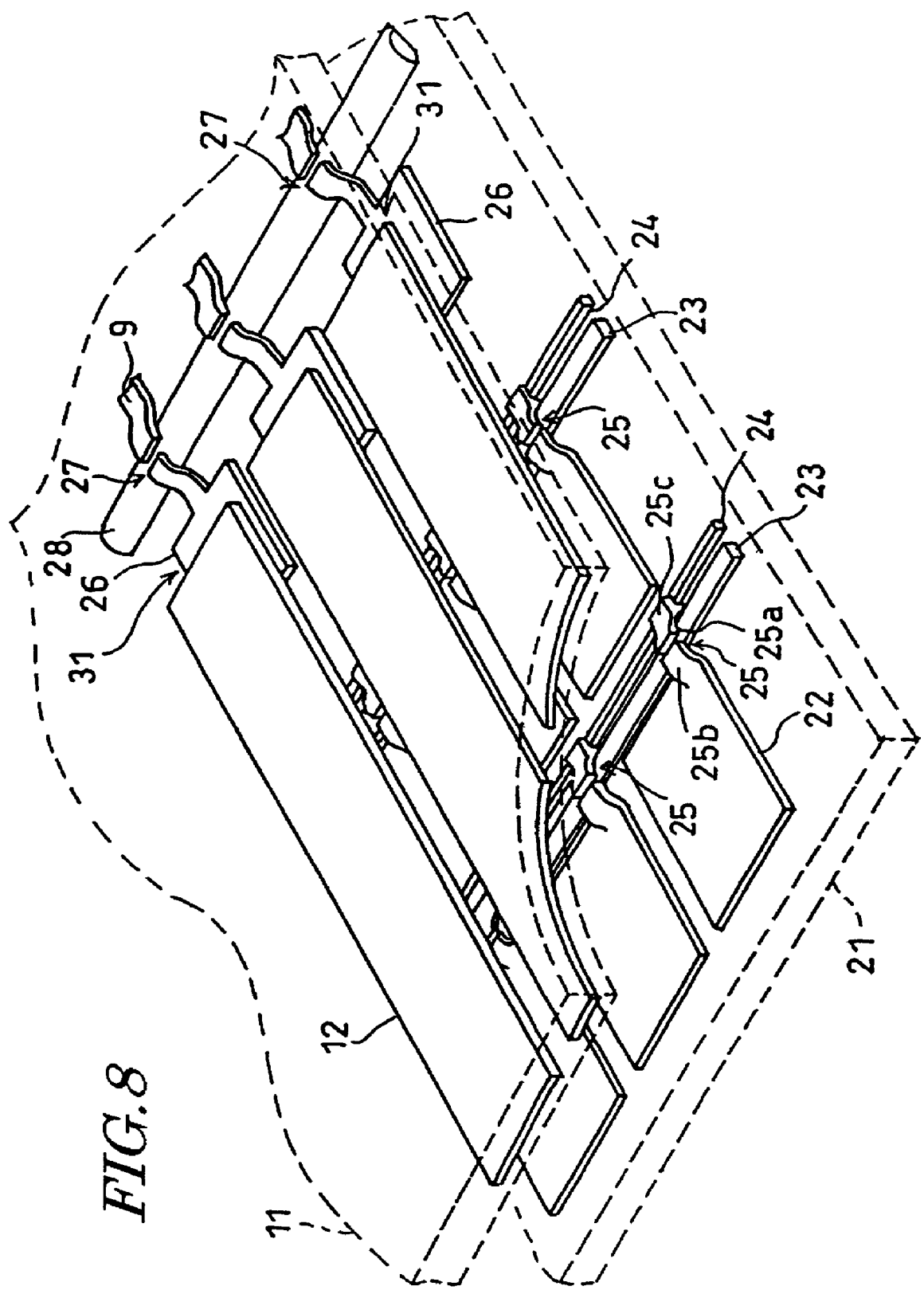
FIG. 8 is a perspective view illustrating a schematic construction of the liquid crystal display device shown in FIG. 7.

As shown in FIG. 8, the liquid crystal display device of this preferred embodiment includes a liquid crystal display panel section, in which a pair of transparent and insulating substrates 11 and 21 of glass, for example, each including electrodes on one surface thereof, are disposed so that those electrodes on the two substrates 11 and 21 face each other and that a predetermined gap exists between these substrates 11 and 21. In the following description, that surface of each substrate 11 or 21 on which the electrodes are formed will be referred to as a "circuitry side" for convenience sake. In the liquid crystal display panel section, an appropriate liquid crystal material (not shown) is hermetically injected into the gap between the pair of glass substrates 11 and 21. On the circuitry side of one glass substrate 11, a plurality of counter signal electrodes (or column electrodes) 12 are formed so as to extend in one direction (i.e., a column direction). On the circuitry side of the other glass substrate 21, a plurality of gate lines (or row electrodes) 23 and a plurality of common lines 24 are formed so as to extend almost vertically to the counter signal electrodes 12 (i.e., in a row direction). A plurality of pixel electrodes 22 are also arranged in matrix on the circuitry side of the glass substrate 21. That is to say, the liquid crystal display device of this preferred embodiment has a so-called "counter source type" electrode arrangement in which the gate lines 23 and pixel electrodes 22 exist on the substrate 21 provided separately from the substrate 11 where the counter signal electrodes 12 exist.

One of the gate lines 23 and associated one of the common lines 24 are paired with each other so that each pair of gate and common lines 23 and 24 extends in the same direction on the glass substrate 21. A predetermined number of pixel electrodes 22 arranged along a row are commonly connected to an associated pair of gate and common lines 23 and 24 by way of pixel switching elements 25 such as thin-film transistors (TFTs).

A vertical signal transfer between the glass substrates 11 and 21, i.e., electrical connection between an associated pair of electrodes 12 and 22, is realized by a signal electrode transfer section 31 and a sealing member layer (to be described later). In the signal electrode transfer section 31, each of the counter signal electrodes 12 on the glass substrate 11 is electrically connected to one output terminal 26 of an associated signal electrode switching element 27 on the glass substrate 21.

The signal electrode switching element 27, implementable as a TFT, for example, is provided for each of the counter signal electrodes 12. In the preferred embodiment illustrated in FIG. 8, a plurality of signal electrode switching elements 27 are arranged side by side in the row direction. The group of signal electrode switching elements 27 arranged along the row are connected to a control line (or control signal line) 28 for controlling the ON/OFF states of the signal electrode switching elements 27 and to a data line introducing section 9 for supplying a data signal to be written onto the counter signal electrodes 12. The control line 28 is formed to extend in the same direction as the gate lines 23 (i.e., in the row direction).

Figure 7:
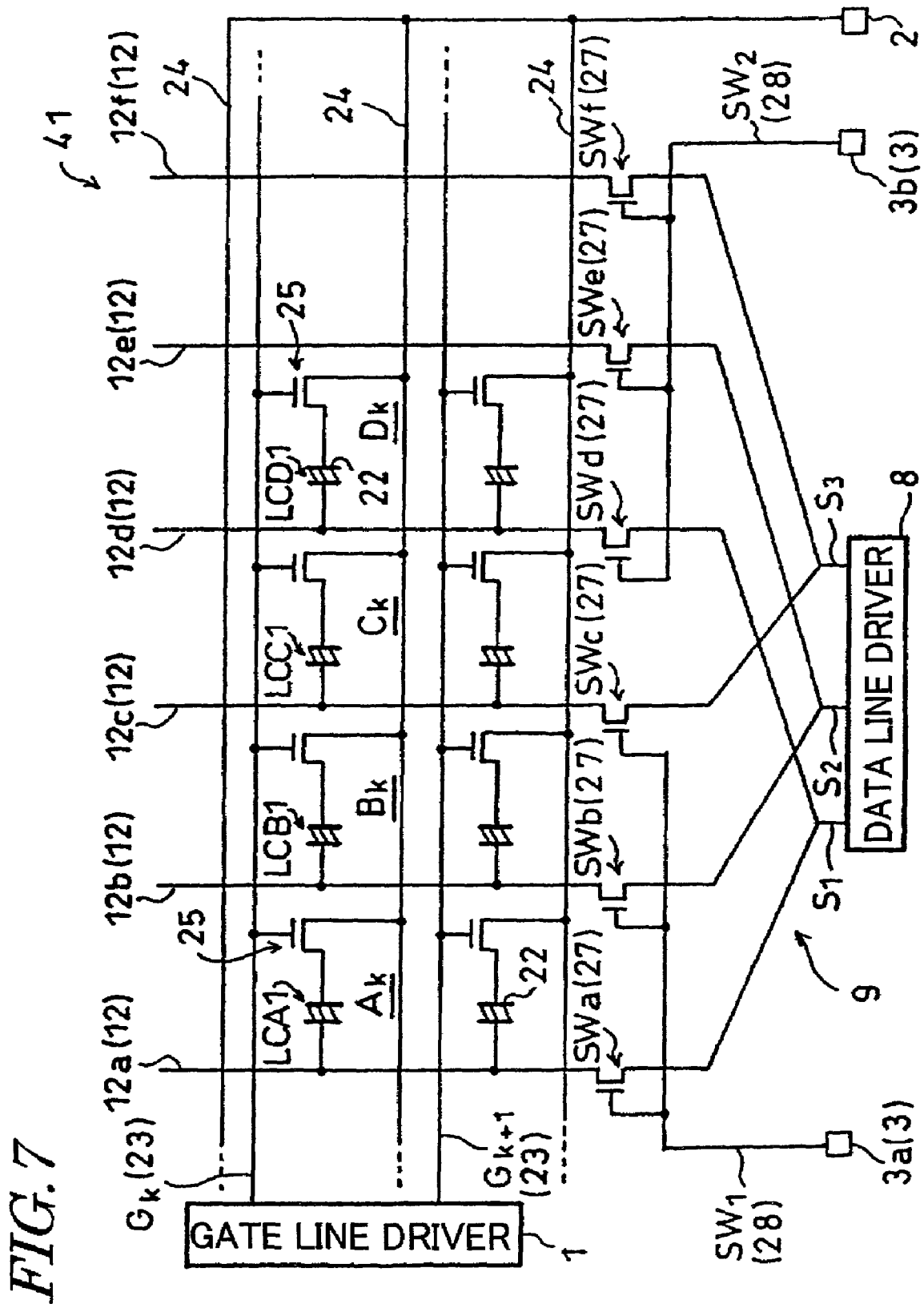
FIG. 7 illustrates an equivalent circuit of a liquid crystal display device according to a second aspect of the present invention.
Figure 9:
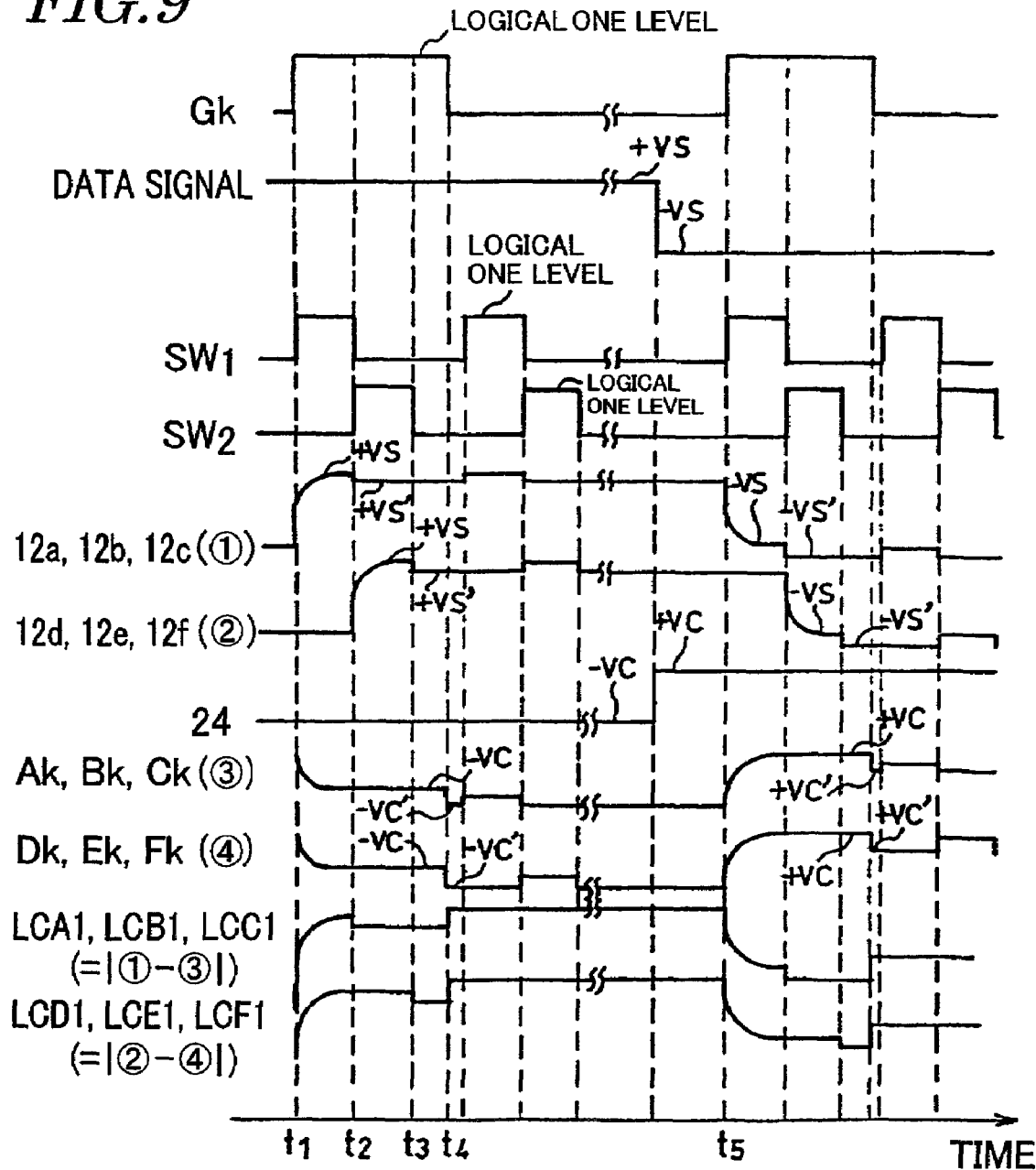
FIG. 9 is a waveform chart illustrating how the liquid crystal display device shown in FIG. 7 may be driven.

As shown in FIG. 7, this liquid crystal display panel section is connected to external drivers including a data line driver 8, a gate line driver 1, a power supply circuit 2 for supplying a voltage at a constant level to the common lines 24 and a controller 3 for controlling the ON/OFF states of the signal electrode switching elements 27. Under the control of these circuits, the liquid crystal display panel section conducts a display operation as a liquid crystal display device in response to a data signal (e.g., video signal). This display operation will be briefly described. First, when one of the gate lines 23 is selected, the pixel switching elements 25 arranged along the gate line 23 selected are turned ON. As a result, a potential level on the associated common line 24 (i.e., a common voltage) is written onto the associated pixel electrodes 22 by way of those pixel switching elements 25. Next, when one of the signal electrode switching elements 27 is turned ON, one of the counter signal electrodes 12, which faces one of the pixel electrodes 22 on which the common voltage has been written, is selected. Then, a voltage corresponding to a signal that represents data to be presented is applied to part of the liquid crystal layer between the counter signal electrode 12 and the pixel electrode 22. In this manner, a display operation is conducted by utilizing the electro-optical effects of the liquid crystal material. This display operation will be described in further detail later with reference to the equivalent circuit diagram of the liquid crystal display device as shown in FIG. 7 and the waveform diagram of drive voltages for the liquid crystal display device as shown in FIG. 9. The operation timings of the pixel switching elements 25 and signal electrode switching elements 27 are controlled in connection with each other. However, means for controlling these timings is not particularly illustrated.

Hereinafter, an exemplary manufacturing process for the liquid crystal display device of this preferred embodiment will be briefly described.

First, the gate lines 23 (which also function as gate electrodes 25a of the pixel switching elements 25) and the common lines 24 are formed on one surface of the glass substrate 21 by depositing an electrode material thereon and then by patterning the material. In this process step, the control line 28 for the signal electrode switching elements 27 is also formed simultaneously.

Next, gate insulating film, semiconductor layer and $n^+$-Si layer to be a source/drain contact layer (none of which is shown) are formed. Then, the gate insulating film is patterned and partially removed so as to have openings required for making electrical contact therethrough. In this manner, a transparent conductive film (made of ITO, for example) to be the common line electrodes 25c and pixel electrodes 22 is formed. Each of the common line electrodes 25c formed in this manner is electrically connected to associated one of the common lines 24 and functions as the drain electrode of associated one of the pixel switching elements 25. On the other hand, one terminal 25b of each pixel electrode 22 functions as the source electrode of its associated pixel switching element 25.

The pixel switching elements (or pixel transistors) 25, each including the gate electrode 25a, drain electrode (i.e., the common line electrode 25c) and source electrode (i.e., one terminal 25b of the pixel electrode 22), are completed through these process steps. It should be noted that the signal electrode switching elements 27, having substantially the same configuration as the pixel switching elements 25, may be formed at the same time. Furthermore, mounting pads that will be used to mount the external data line driver 8 (see FIG. 7) onto the liquid crystal panel and the data line introducing section 9 (see FIG. 7) are also formed in this process step. In this embodiment, the pixel switching elements 25 and the signal electrode switching elements 27 are formed on the same substrate 21. Alternatively, the pixel switching elements 25 may be formed on the substrate 21 and the signal electrode switching elements 27 may be formed on the other substrate 11.

On the glass substrate (i.e., insulating substrate) 11 to be a counter substrate, color filters and black matrix have been provided in advance to form a predetermined pattern. Next, a transparent conductive film of indium tin oxide (ITO), for example, is deposited over the glass substrate 11 and then patterned into the shape shown in FIG. 8, thereby forming the counter signal electrodes 12.

Next, these glass substrates 11 and 21, on which the electrodes have been formed in the above-described manner, are bonded to each other so that their circuitry sides face each other. First, the periphery of one of the glass substrates 11 or 21 is coated with a sealing agent, obtained by mixing conductive particles of gold, silver or copper, for example, into an adhesive, thereby forming a sealing member layer in the shape of a frame. In this case, openings are formed in parts of the sealing member layer. Then, after spacers (not shown) have been dispersed over the circuitry sides to make the gap between the substrates (i.e., liquid crystal layer) have a constant thickness, these substrates 11 and 21 are bonded to each other and the sealing member is cured by heating it. Thereafter, a liquid crystal material is injected through the openings. Finally, the openings are closed with an end-sealing material (not shown), thereby completing a display panel for a liquid crystal display device. The sealing member contains the conductive particles as described above. Accordingly, the sealing member not only seals the gap between the glass substrates 11 and 21 but also functions as the signal transfer section for electrically connecting these substrates together.

It should be noted that a sealing member of this type has already been used extensively for a passive-matrix-addressed liquid crystal display device using an STN (super twisted nematic) liquid crystal material, for example. This sealing member greatly contributes to connecting upper and lower substrates (corresponding to the glass substrates 11 and 21 in this embodiment) together at a narrow pitch without allowing a leakage current to flow laterally (see Japanese Laid-Open Publication No. 11-326934, for example).

Hereinafter, with reference to the equivalent circuit diagram of the liquid crystal display device as shown in FIG. 7 and the waveform diagram of drive voltages for the liquid crystal display device as shown in FIG. 9, it will be described in further detail how this display device conducts a display operation.

The liquid crystal display panel section 41, functioning as the display section of the liquid crystal display device, has the configuration already described by reference to FIG. 8. As shown in FIG. 7, a plurality of pixels Ak, Bk, Ck, Dk, etc. are formed as liquid crystal display area units for respective pixel electrodes 22. Onto this liquid crystal display panel section 41, external drivers, including the data line driver 8, gate line driver 1, power supply circuit 2 for supplying a voltage at a constant level to the common lines 24 and controller 3 for controlling the ON/OFF states of the signal electrode switching elements 27, are mounted. It should be noted that the liquid crystal display panel section 41 actually includes a huge number of counter signal electrodes, gate lines and common lines. In the embodiment illustrated in FIG. 7, however, only six counter signal electrodes 12a through 12f, only two gate lines 23 (Gk and Gk+1) and only three common lines 24 are illustrated for the sake of simplicity of description.

As shown in FIG. 7, one terminal of each of the counter signal electrodes 12a through 12f is connected to one terminal of its associated signal electrode switching element 27 (SWa, SWb, SWc, SWd, SWe, SWf). Another terminal of each of these signal electrode switching elements 27 is electrically connected to the data line driver 8 including a source driver IC, for example. More specifically, output lines S1, S2 and S3 have been extended from the output stage of the data line driver 8. Each of these output lines S1, S2 and S3 is branched into two lines, which are respectively connected to two of the signal electrode switching elements 27 belonging to mutually different blocks (to be described below).

A controller 3a is electrically connected to the respective control terminals of the signal electrode switching elements SWa, SWb and SWC by way of a control line SW1 to selectively turn ON or OFF these switching elements SWa, SWb and SWc. On the other hand, another controller 3b is electrically connected to the respective control terminals of the signal electrode switching elements SWd, SWe and SWf by way of another control line SW2 to selectively turn ON or OFF these switching elements SWd, SWe and SWf.

Accordingly, the ON/OFF states of the counter signal electrodes 12 are controlled by a time sharing technique on a block-by-block basis. More specifically, the counter signal electrodes 12a, 12b and 12c belonging to a first block and the counter signal electrodes 12d, 12e and 12f belonging to a second block are controlled independent of each other.

That is to say, the counter signal electrodes 12 or the gate lines 23 may be grouped into respective blocks. If the counter signal electrodes 12 are grouped, an interval during which one gate line 23 is selected (i.e., one horizontal scanning interval) is divided into multiple sub-intervals so that a data signal is supplied to the respective blocks sequentially. On the other hand, as for the gate lines 23, one vertical scanning interval is divided into multiple sub-intervals so that a scan signal is supplied to the respective block sequentially. In this manner, the destination blocks of the data or scan signal may be changed with time. In the embodiment illustrated in FIG. 7, the counter signal electrodes 12 are grouped into multiple blocks and an interval during which one gate line 23 is selected is divided into multiple sub-intervals so that the data signal is supplied to the respective blocks sequentially, i.e., the signal destination blocks are changed with time.

Hereinafter, it will be described with reference to FIGS. 7 and 9 how to drive the liquid crystal display device. In this example, a data signal (+VS, −VS) with the maximum amplitude is supplied from the data line driver 8 to the respective counter signal electrodes 12 through the output lines S1, S2 and S3 to conduct a black display on the entire screen of the liquid crystal display panel section 41. It should be noted, however, that the present invention is not limited to this particular example.

First, at a time t1, a scan signal supplied from the gate line driver 1 rises to logical one level to select the gate line Gk. Then, to turn ON the signal electrode switching elements 27 while the gate line Gk is being selected, control signals are supplied through the control lines SW1 and SW2 in this order. The control signal supplied through the control line SW2 has the same waveform as the control signal supplied through the control line SW1 except that when the control signal on the control line SW1 falls to logical zero level (e.g., at a time t2), the control signal on the control line SW2 rises to logical one level.

At the same time t1, the signal on the control line SW1 rises to logical one level, thereby turning ON the signal electrode switching elements SWa, SWb and SWc connected to the control line SW1. As a result, the data signal (+VS) is supplied from the data line driver 8 to the counter signal electrodes 12a, 12b and 12c as indicated by ① in FIG. 9. Since the gate line Gk is now selected, a potential level (−VC) on the common line 24 is written on the pixels (more exactly, pixel electrodes 22) Ak, Bk and Ck as indicated by ③ in FIG. 9. As a result, a voltage (VS+VC) (i.e., the absolute value of the difference obtained by subtracting ③ from ① in the example illustrated in FIG. 9) is applied to respective parts LCA1, LCB1 and LCC1 of the liquid crystal layer corresponding to these pixels Ak, Bk and Ck. On the other hand, since the other control line SW2 is not selected in this interval, no data signal is supplied to the counter signal electrodes 12d, 12e and 12f.

Next, at the time t2, the control line SW1 is deactivated to turn OFF the signal electrode switching elements SWa, SWb and SWc. Thus, the potential level on the counter signal electrodes 12a, 12b and 12c should be held. However, the instant these signal electrode switching elements SWa, SWb and SWc change from the selected state into the non-selected state, the potential level on the counter signal electrodes 12a, 12b and 12c is dropped due to the parasitic capacitance created by the signal electrode switching elements SWa, SWb and SWc. As a result, the counter signal electrodes 12a, 12b and 12c come to have a potential level of +VS' that is lower than +VS. At this time t2, the control line SW2 is activated to turn ON the signal electrode switching elements SWd, SWe and SWd. Thus, the data signal (+VS) is supplied from the data line driver 8 to the counter signal electrodes 12d, 12e and 12f as indicated by ② in FIG. 9. As a result, a voltage (VS +VC) (i.e., the absolute value of the difference obtained by subtracting ④ from ② in the example illustrated in FIG. 9) is applied to respective parts LCD1, LCE1 and LCF1 of the liquid crystal layer corresponding to these pixels Dk, Ek and Fk.

Next, at a time t3, the control line SW2 is also deactivated to turn OFF the signal electrode switching elements SWd, SWe and SWf. As a result, the potential level at the counter signal electrodes 12*d* through 12*f* is dropped to +VS' as in the counter signal electrodes 12*a* through 12*c*.

Subsequently, at a time t4, the scan signal that has been supplied onto the gate line Gk falls to logical zero level, thereby turning OFF all the pixel switching elements 25 arranged along the gate line Gk. The instant these pixel switching elements 25 change from the selected state into the non-selected state, the potential level at the associated pixel electrodes 22 is dropped due to the parasitic capacitance of the switching elements 25. As a result, the potential level at the pixels (more exactly, pixel electrodes 22) Ak, Bk, Ck, Dk, Ek and Fk falls to −VC', which is lower than −VC. Accordingly, in a retention interval between the time t4 when the pixel switching elements 25 are turned OFF to fix the voltage retained in the liquid crystal layer and the next write timing t5, a voltage of VS'+VC' is applied to the liquid crystal layer.

In this case, the drop ΔVS ($\geqq 0$) in potential level at the counter signal electrodes 12 as caused by the switching of the signal electrode switching elements 27 is given by $$\Delta VS = VS - VS'$$

while the drop ΔVC ($\geqq 0$) in potential level at the pixel electrodes 22 as caused by the switching of the pixel switching elements 25 is given by $$\Delta VC = VC' - VC$$

Accordingly, the voltage applied to the liquid crystal layer in the retention interval is $$VS' + VC' = VS + VC - (\Delta VS - \Delta VC)$$

As for the next frame, i.e., an interval that starts at the time t5 to write a negative potential level, the potential drops are also similarly calculated by $$\Delta VS = VS - VS' \text{ and}$$

$$\Delta VC = VC' - VC$$

Accordingly, the voltage applied to the liquid crystal layer in the retention interval is $$-VS' - VC' = -(VS + VC) + (\Delta VS - \Delta VC)$$

That is to say, a voltage, offset from the originally intended voltage ±(VS+VC) by ±(ΔVS−ΔVC), is actually applied to the liquid crystal layer.

In this case, if the pixel switching elements 25 and the signal electrode switching elements 27 are designed so as to satisfy ΔVC=ΔVS, then the DC voltage component on the common lines 24 is equal to the DC voltage component on the counter signal electrodes 12. That is to say, the offset ±(ΔVS−ΔVC) of the voltage applied to the liquid crystal layer becomes zero. Accordingly, there is no need to superpose the DC value, corresponding to the offset, on the DC voltage component of the counter signal electrodes 12 or common lines 24 using a voltage regulator, for example, so as to prevent the DC voltage component from being applied to the liquid crystal layer.

Also, in this case, a voltage range of a power supply prepared for the counter signal electrodes 12 should fall within a voltage range of a power supply prepared for the common lines 24, and vice versa. Accordingly, there is no need to prepare two power supplies separately for the counter signal electrodes 12 and common lines 24, thus reducing the power dissipation advantageously.

Furthermore, even if the offset ±(ΔVS−ΔVC) of the voltage applied to the liquid crystal layer is not equal to zero, the voltage offset is minimized because ΔVS and ΔVC cancel each other. As a result, a voltage much closer to the intended voltage ±(VS+VC) is applied to the liquid crystal layer as compared to the conventional structure.

In the conventional structure (i.e., the second conventional structure described in the background of the invention), the pixel electrodes and the data lines are formed on the same substrate and the ON/OFF states thereof are controlled by the pixel switching elements and the data line switching elements, respectively. In that case, the offset of the voltage applied to the liquid crystal layer is ±(ΔVS+ΔVC). Since ΔVS and ΔVC are both positive quantities, the offset cannot be canceled but the voltage to be applied to the liquid crystal layer is further dropped. As a result, a voltage, which is much different from the intended voltage, is applied to the liquid crystal layer unintentionally. In that case, the applied voltage level should be corrected using a circuit for regulating the counter voltage level, for example. In contrast, according to this preferred embodiment, the voltage offset resulting from the variation in potential level at the counter signal electrodes 12 and the voltage offset resulting from the variation in potential level at the pixel electrodes 22 cancel each other. Thus, no applied voltage level correction is needed. Furthermore, even if the applied voltage level should be corrected, the correction may be much smaller. Accordingly, a voltage regulator with a much simpler configuration may be used and the power dissipation can be reduced.

It should be noted that ΔVC and ΔVS are normally given by $$\Delta VC = Cgd/Cpix \times Vgpp$$

$$\Delta VS = Csws/Cs \times Vswpp$$

where Cgd is a parasitic capacitance formed between the gate electrode of a pixel switching element and the associated pixel;

Cpix is a total capacitance (electrostatic capacitance) of the pixel;

Vgpp is a voltage difference of a signal on a gate line between the logical one and logical zero states thereof;

Csws is a parasitic capacitance formed between the gate electrode of a signal electrode switching element and the associated counter signal electrode;

Cs is a total capacitance (electrostatic capacitance) of the counter signal electrode; and Vswpp is a voltage difference of a signal on the control line between the logical one and logical zero states thereof.

If the thickness of the gate insulating film or the gate width or the gate-drain overlap of the transistors (i.e., switching elements) has changed due to some variation in a manufacturing process condition, then Cgd or Csws changes greatly. However, it is impossible to eliminate these variations completely from the actual manufacturing process. Accordingly, in the prior art, the DC level of the counter electrode should be adjusted for each display panel of the liquid crystal display device (with the second conventional structure).

Even in the liquid crystal display device of this preferred embodiment, if the offset ±(ΔVS−ΔVC) of the voltage applied to the liquid crystal layer is not zero, then voltage regulation is needed to eliminate this voltage offset from each liquid crystal display panel. However, if ΔVC=ΔVS, then no DC voltage is applied to the pixels and no potential level variation should occur no matter whether there is a variation in a process condition or not. Thus, no voltage regulation is needed in that case.

Generally speaking, the voltage level on the gate lines 23 is often equal to the voltage level on the control lines SW1 and SW2. This is because these voltage levels are often a unique value determined for each specific device to drive a switching element made of amorphous silicon, for example. Accordingly, Vgpp and Vswpp may normally be regarded as equal to each other. Thus, to satisfy $\Delta VC=\Delta VS$, Cgd/Cpix should be equal to Csws/Cs.

Suppose the pixel switching elements and the signal electrode switching elements are designed in such a manner as to minimize Cgd and Csws by adopting the minimum permissible rule of the manufacturing process as the channel length of the transistors. In that case, the ability to apply a predetermined voltage to the counter signal electrodes or the pixel electrodes, i.e., chargeability, is defined as a ratio of the channel width of each of those switching elements to the load capacitance. This is because these switching elements have the same channel length.

The channel width/load capacitance ratios are preferably substantially equalized with each other for the signal electrode switching elements and the pixel switching elements. The load capacitance is the electrostatic capacitance of the counter signal electrode or the pixel electrode. In that case, the parasitic capacitance/load capacitance ratios of the signal electrode switching elements and the pixel switching elements will also be equal to each other. That is to say, Cgd/Cpix and Csws/Cs become equal to each other. The signal electrode switching elements and the pixel switching elements have almost the same structure except that the channel widths of these switching elements are different from each other. Accordingly, the variation in thickness of the gate insulating film or in direction or length of the pattern shift is almost equally observed in both of these two types of switching elements. Thus, these two types of switching elements are equally affected by the variation. That is to say, even if any manufacturing process parameter has changed, the relationship Cgd/Cpix=Csws/Cs is maintained. As a result, $\Delta VC=\Delta VS$ is still satisfied.

Furthermore, the pixel switching elements and the signal electrode switching elements preferably have substantially the same channel length direction. In this case, the "channel" of each switching element refers to an area interposed between the source/drain regions of an $n^+$-Si (amorphous silicon) layer used as a source/drain contact layer. The "channel length" is a size of the channel corresponding to the gap between the source/drain regions as is normally defined. On the other hand, the "channel width" is a size of the channel as measured in the direction vertical to the source/drain direction. Also, the "channel length direction" means a direction in which the channel extends between the source/drain regions (i.e., the source/drain direction). A shift in the channel length direction causes variations in characteristics of the TFTs. However, even if a pattern shift or misalignment has occurred in a particular direction during the manufacturing process of this display device, the drop in potential level at the pixel electrodes as caused by the pixel switching elements is substantially equal to the drop in potential level at the counter signal electrodes as caused by the signal electrode switching elements. As a result, the above-described effects are still achievable. That is to say, Cgd/Cpix=Csws/Cs is still satisfied and the DC levels of the counter signal electrodes and the common lines are not different from each other.

As described above, the liquid crystal display device of this preferred embodiment includes: a pair of substrates disposed so as to face each other and be spaced apart from each other; a liquid crystal layer injected into the gap between the substrates; a plurality of counter signal electrodes arranged in a column direction on one of the two substrates; a plurality of signal electrode transfer sections for electrically connecting the counter signal electrodes to the other substrate; a plurality of pixel electrodes formed on the other substrate; a plurality of pixel switching elements connected to the respective pixel electrodes; a plurality of gate lines arranged in a row direction to control the operations of the pixel switching elements; a plurality of common lines connected to the pixel electrodes via the pixel switching elements; and a plurality of signal electrode switching elements, which are formed on the other substrate and each of which has one of its terminals electrically connected to associated one of the counter signal electrodes.

In this structure, the drop in potential level at the pixel electrodes as caused by the switching of the pixel switching elements and the drop in potential level at the counter signal electrodes as caused by the switching of the counter electrode switching elements cancel each other. Accordingly, a voltage even closer to the intended one is applicable to the liquid crystal layer without regulating the potential levels at the pixel electrodes or the counter signal electrodes.

In the display device of this fifth specific embodiment, the data line driver and/or the gate line driver may have a monolithic configuration as in the second or third embodiment described above. Also, in the display device of the fifth embodiment, the pixels may be driven by a point sequential addressing technique as in the display device of the fourth embodiment.

In the display device according to the second aspect of the present invention, even if the signal electrode switching elements and the pixel switching elements are of the same channel type, at least the following effects and advantages are achievable.

Specifically, the counter signal electrodes are formed on the counter substrate provided separately from the substrate on which the gate lines are formed. Thus, the capacitance formed by the counter signal electrodes decreases and the load on the driver is reduced. In addition, short-circuit failures are eliminated from the intersections between the counter signal electrodes and the gate lines. The display device further includes a plurality of signal electrode switching elements, each of which is connected to associated one of the counter signal electrodes to control the supply of a data signal to the counter signal electrode. As a result, the number of external drivers required is reduced and the drivers may be mounted along one side.

As described above, in the display device and its driving method of the present invention, the application of an unwanted direct current voltage component to the display medium layer is suppressed and a voltage even closer to the intended level is applied to the display medium layer. Accordingly, there is no need to newly apply a voltage to the display medium layer for the purpose of compensating for the undesired voltage component. As a result, unwanted power dissipation is minimized.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A display device comprising:
an active matrix substrate;
a counter electrode;
display medium layer interposed between the active matrix substrate and the counter electrode; and
a plurality of pixels,
wherein the active matrix substrate includes;
a base plate;
a plurality of pixel electrodes formed on the base plate, each said pixel electrode being associated with one of the plurality of pixels;
a plurality of pixel switching elements, each said pixel switching element being connected to associated one of the pixel electrodes;
a plurality of gate lines for controlling operations of the pixel switching elements;
a plurality of data lines, each said data line being connected to associated ones of the pixel electrodes by way of associated ones of the pixel switching elements so as to supply a data signal therethrough;
a plurality of data line switching elements, each said data line switching element having terminals, one of said terminals being connected to associated one of the data lines;
a plurality of signal input terminals, each said signal input terminal being connected to another terminal of associated one of the data line switching elements and another terminal of another associated one of the data line switching elements;
a data line branching section, which is provided between the signal input terminals and the data line switching elements; and
a control line, which is connected to the data line switching elements to selectively turn ON or OFF the data line switching elements,
wherein a signal to turn ON the data line switching elements and a signal to turn ON the pixel switching elements have mutually different polarities, and
wherein each said pixel switching element and each said data line switching element are thin-film transistors that have substantially the same channel length, and
wherein a ratio of a channel width of each said pixel switching element to an electrostatic capacitance of associated one of the pixels is substantially equal to a ratio of a channel width of each said data line switching element to an electrostatic capacitance of associated one of the data lines.

2. The display device of claim 1, wherein each said pixel switching element and each said data line switching element are thin-film transistors, and
wherein the thin-film transistors have channels extending in parallel with each other.

3. A display device comprising:
an active matrix substrate;
a counter electrode;
a display medium layer interposed between the active matrix substrate and the counter electrode; and
a plurality of pixels,
wherein the active matrix substrate includes;
a base plate;
a plurality of pixel electrodes formed on the base plate, each said pixel electrode being associated with one of the plurality of pixels;
a plurality of pixel switching elements, each said pixel switching element being connected to associated one of the pixel electrodes;
a plurality of gate lines for controlling operations of the pixel switching elements;
a plurality of data lines, each said data line being connected to associated ones of the pixel electrodes by way of associated ones of the pixel switching elements so as to supply a data signal therethrough;
a plurality of data line switching elements, each said data line switching element having terminals, one of said terminals being connected to associated one of the data lines;
a plurality of signal input terminals, each said signal input terminal being connected to another terminal of associated one of the data line switching elements and another terminal of another associated one of the data line switching elemets;
a data line branching section, which is provided between the signal input terminals and the data line switching elements; and
a control line, which is connected to the data line switching elements to selectively turn ON or OFF the data line switching elements,
wherein a signal to turn ON the data line switching elements and a signal to turn ON the pixel switching elements have mutually different polarities, and
wherein each said pixel switching element is an n-channel transistor or a p-channel transistor, and
wherein if the pixel switching element is an n-channel transistor, each said data line switching element is a p-channel transistor, and
wherein if the pixel switching element is a p-channel transistor, the data line switching element is an n-channel transistor.

4. The display device of claim 3, wherein the pixel switching element is an n-channel transistor and the data line switching element is a p-channcl transistor.

5. A display device comprising:
an active matrix substrate;
a counter electrode;
a display medium layer interposed between the active matrix substrate and the counter electrode; and
a plurality of pixels,
wherein the active matrix substrate includes;
a base plate;
a plurality of pixel electrodes formed on the base plate, each said pixel electrode being associated with one of the plurality of pixels;
a plurality of pixel switching elements, each said pixel switching element being connected to associated one of the pixel electrodes;
a plurality of gate lines for controlling operations of the pixel switching elements;
a plurality of data lines, each said data line being connected to associated ones of the pixel electrodes by way of associated ones of the pixel switching elements so as to supply a data signal therethrough;
a plurality of the dats line switching elements, each said data line switching element having terminals, one of said terminals being connected to associated one of the data lines;
a plurality of signal input terminals, each said signsl input terminal being connected to another terminal of associated one of the data line switching elements and another terminal of another associated one of the data line switching elements;

a data line branching section, which is provided between the signal input terminals and the data line switching elements; and a control line, which is connected to the data line switching elements to selectively turn ON or OFF the data line switching elements, wherein a signal to turn ON the data line switching elements and a signal to turn ON the pixel switching elements have mutually different polarities, and wherein each said pixel switching element is an n-chaimel transistor or a p-channel transistor, while each said data line switching element includes an n-channel transistor and a p-channel transistor that are connected in parallel with each other, and wherein in the data line switching element, one of the p-and n-channel transistors that has a polarity different from that of the pixel switching element has a channel length or channel width greater than that of the other transistor.

6. The display device of claim 1, wherein each said pixel switching element and each said data line switching element both have a semiconductor layer, which has been deposited on the base plate, as a transistor active region.

7. The display device of claim 1, wherein the display medium layer is a liquid crystal layer.

8. A display device comprising:
a pair of substrates that is disposed so as to face each other and be spaced apart from each other;
a display medium layer interposed between the pair of substrates; and
a plurality of pixels,
wherein a plurality of counter signal electrodes, each of which extends in a column direction and through which a data signal is supplied, are formed on one of the pair of substrates, and
wherein the other of the pair of substrate includes;
a plurality of pixel electrodes arranged in matrix, each said pixel electrode being associated with one of the plurality of pixels;
a plurality of pixel switching elements, each of which is 40 connected to associated one of the pixel electrodes;
a plurality of gate lines, which extend in a row direction and are used for controlling operations of the pixel switching elements; and
a plurality of common lines, each of which is connected to associated ones of the pixel electrodes by way of associated ones of the pixel switching elements, and
wherein the display device further includes;
a plurality of signal electrode switching elements, each of which is connected to associated one of the counter signal electrodes and controls supply of the data signal to the counter signal electrode, and
a plurality of signal electrode transfer sections, each of which is used to ensure electrical connection between each of the signal electrode switching elements and associated one of the counter signal electrodes,
wherenin a signal to turn ON the signal electrode switching elements and a signal to turn ON the pixel switching elements have the same polarity, and
wherein the signal electrode switching elements and the pixel switching elements are formed on the same substrate.

9. A display device comprising:
a pair of substrates that is disposed so as to face each other and be spaced apart from each other;
a display medium layer interposed between the pair of substrates; and a plurality of pixels,
wherein a plurality of counter signal electrodes, each of which extends in a column direction and through which a data signal is suppled, are formed on one of the pair of substrates, and
wherein the other of the pair of substrate includes;
a plurality of pixel electrodes arranged in matrix, each said pixel electrode being associated with one of the plurality of pixels;
plurality of pixel switching elements, each of which is connected to associated one of the pixel electrodes;
a plurality of gate lines, which extend in a row direction and are used for controlling operations of the pixel switching elements; and
a plurality of common lines, each of which is connected to associated ones of the pixel electrodes by way of associated ones of the pixel switching elements,
wherein the display device further includes a plurality of signal electrode switching elements, each of which is connected to associatcd one of the counter signal electrodes and controls supply of the data signal to the counter signal electrode, and
wherein a signal to turn ON the signal electrode switching elements and a signal to turn ON the pixel switching elements have the same polarity, and
wherein each said pixel switching element and each said signal electrode switching element are thin-film transistors that have substantially the same channel length, and
wherein a ratio of a channel width of each said pixel switching element to an electrostatic capacitance of associated one of the pixels is substantially equal to a ratio of a channel width of each said signal electrode switching element to an electrostatic capacitance of associated one of the counter signal electrodes.

10. The display device of claim 8, wherein each said pixel switching element and each said signal electrode switching element are thin-film transistors, and
wherein channels of the thin-film transistors extend substantially in parallel with each other.

11. The display device of claim 8, wherein each said pixel switching element and each said signal electrode switching element are both n-channel transistors.

12. The display device of claim 8, wherein each said pixel switching element and each said signal electrode switching element are both p-channel transistors.

13. The display device of claim 8, wherein the display medium layer is a liquid crystal layer.

14. The display device of claim 1, wherein a potential drop (or rise) associated with the data line switching elements being turned from ON to OFF is almost equal to a potential drop (or rise) associated with the pixel switching elements being turned from ON to OFF.

15. A display device comprising:
an active matrix substrate;
a counter electrode;
a display medium layer interposed between the active matrix substrate and the counter electrode; and
a plurality of pixels,
wherein the active matrix substrate includes;
a base plate;
a plurality of pixel electrodes formed on the base plate, each said pixel electrode being associated with one of the plurality of pixels;
a plurality of pixel switching elements, each said pixel switching element being connected to associated one of the pixel electrodes;

a plurality of gate lines for controlling operations of the pixel switching elements;

a plurality of data lines, each said data line being connected to associated ones of the pixel electrodes by way of associated ones of the pixel switching elements so as to supply a data signal therethrough;

a plurality of data line switching elements, each said data line switching element having terminals, one of said terminals being connected to associated one of the data lines;

a plurality of signal input terminals, each said signal input terminal being connected to another terminal of associated one of the data line switching elements and anoter terminal of another associated one of the data line switching elements;

a data line branching section, which is provided between the signal input terminals and the data line switching elements; and a control line, which is connected to the data line switching elements to selectively turn ON or OFF the data line switching elements;

a power supply having a voltage range for supplying voltages to the data lines; and a power supply having a voltage range for supplying voltages to the counter electrode; and wherein a signal to turn ON the data line switching elements and a signal to turn ON the pixel switching elements have mutually different polarities, and wherein one of (1) the voltage range of the power supply for supplying voltages to the data lines is within the voltage range of the power supply for supplying voltages to the counter electrode or (2) the voltage range of the power supply for supplying voltages to the counter electrode is within the voltage range of the power supply for supplying voltages to the data lines.

16. The display device of claim 1, wherein voltages supplied to the data lines and the signal lines have mutually different polarity.

17. A display device comprising:
an active matrix substrate;
a counter electrode;
a display medium layer interposed between the active matrix substrate and the counter electrode; and
a plurality of pixels;
wherein the active matrix substrate includes;
a base plate;
a plurality of pixel electrodes formed on the base plate, each said pixel electrode being associated with one of the plurality of pixels;
a plurality of pixel switching elements, each said pixel switching element being connected to associated one of the pixel electrodes;
a plurality of gate lines for controlling operations of the pixel switching elements;
a plurality of data lines, each said data line being connected to associated ones of the pixel electrodes by way of associated ones of the pixel switching elements so as to supply a data signal therethrough;
a plurality of data line switching elements, each said data line switching element having terminals, one of said terminals being connected to associated one of the data lines;
a plurality of signal input terminals, each said signal input terminal being connected to another terminal of associated one of the data line switching elements and another terminal of another associated one of the data line switching elements;

a data line branching section, which is provided between the signal input terminals and the data line switching elements;

a control line which is connected to the data line switching elements to selectively turn ON or OFF the data line switching elements;

a power supply having a voltage range for supplying voltages to the data lines; and a power supply having a voltage range for supplying voltages to the counter electrode; and wherein a signal to turn ON the data line switching elements and a signal to turn ON the pixel switching elements have mutually different polarities, and wherein one of (1) the voltage range of the power supply for supplying voltages to the data lines is within the voltage range of the power supply for supplying voltages to the counter electrode or (2) the voltage range of the power supply for supplying voltages to the counter electrode is within the voltage range of the power supply for supplying voltages to the data lines.

18. A display device comprising:
an active matrix substrate;
a counter electrode;
a display medium layer interposed between the active matrix substrate and the counter electrode; and
a plurality of pixels,
wherein the active matrix substrate includes;
a base plate;
a plurality of pixel electrodes formed on the base plate, each said pixel electrode being associated with one of the plurality of pixels;
a plurality of pixel switching elements, each said pixel switching element being connected to associated one of the pixel electrodes;
a plurality of gate lines for controlling operations of the pixel switching element;
a plurality of data lines, each said data line being connected to associated ones of the pixel electrodes by way of associated ones of the pixel switching elements so as to supply a data signal therethrough;
a plurality of data line switching elements, each said data line switching element having terminals, one of said terminals being connected to associated one of the data lines;
a plurality of signal input terminals, each said signal input terminal being connected to another terminal of associated one of the data line switching elements and another terminal of another associated one of the data line switching elements;
a data line branching section, which is provided between the signal input terminals and the data line switching elements; and
a control line, which is connected to the data line switching elements to selectively turn ON or OFF the data line switching elements, wherein a signal to turn ON the data line switching elements and a signal to turn ON the pixel switching elements have mutually different polarities, and wherein a potential drop (or rise) associated with the data line switching elements being turned from ON to OFF and a potenetial drop (or rise) associated with the pixel switching elements being turned from ON to OFF is such that unfavorable direct current components are further reduced and so that a voltage at a level closer to a desired voltage is applied to the display medium.

19. An active matrix substrate comprising:
a base plate;

a plurality of pixel electrodes formed on the base plate;
a plurality of pixel switching elements, each said pixel switching element being connected to associated one of the pixel electrodes;
a plurality of gate lines for controlling operations of the pixel switching elements;
a plurality of data lines, each said data line being connected to associated ones of the pixel electrodes by way of associated ones of the pixel switching elements so as to supply a data signal therethrough;
a plurality of data line switching elements, each said data line switching element having terminals, one of said terminals being connected to associated one of the data lines;
a plurality of signal terminals, each said signal input terminal being connected to another terminal of associated one of data line switching elements and another terminal of another associated one of the data line switching elements;
a data line branching section, which is provided between the signal input terminals and the data line switching elements;
a control line, which is connected to the data line switching elements to selectively turn ON or OFF the data line switching elements;
a power supply having a voltage range for supplying voltages to the data lines; and
a power supply having a voltage range for supplying voltages to the counter electrode; and
wherein a signal to turn ON the data line switching elements and a signal to turn ON the pixel switching elements have mutually different polarities, and
wherein one of (1) the voltage range of the power supply for supplying voltages to the data lines is within the voltage range of the power supply for supplying voltages to the counter electrode or (2) the voltage range of the power supply for supplying voltages to the counter electrode is within the voltage range of the power supply for supplying voltages to the data lines.

20. A display device comprising a display region unit, wherein the display region unit includes;
a substrate on which a plurality of pixels are arranged in columns and rows;
a driver for driving the pixels;
switching means, formed on the substrate, for changing an electrical connection state between the pixels and the driver; and
wherein the switching means includes;
a first switching element located closer to one of the pixels,
a second switching element located closer to the driver,
wherein a signal to turn ON the first switching element and a signal to turn ON the second switching element have mutually different polarities, and
wherein a potential drop (or rise) associated with the first switching element being turned from ON to OFF and a potential drop (or rise) associated with the second switching element being turned from ON to OFF is such as to minimize a variation in voltage being applied to a display medium.

21. A display device comprising a display region unit, wherein the display region unit includes;
a substrate on which a plurality of pixels are arranged in columns and rows;
a driver for driving the pixels; and
switching means, formed on the substrate, for changing an electrical connection state between the pixels and the driver; and
wherein the switching means includes;
a first switching element located closer to one of the pixels,
a second switching element located closer to the driver,
wherein a signal to turn ON the first switching element and a signal to turn ON the second switching element have mutually different polarities, and
wherein a potential drop (or rise) associated with the first switching element being turned from ON to OFF and a potential drop (or rise) associated with the second switching element being turned from ON to OFF is such that unfavorable direct current components are further reduced and so that a voltage at a level closer to a desired voltage is applied to a display medium.

22. The display device of claim 20, wherein voltages supplied to the data lines and the signal lines have mutually different polarity.

23. A display device comprising a display region unit, wherein the display region unit includes;
a substrate on which a plurality of pixels are arranged in columns and rows;
a driver for driving the pixels; and
switching means formed on the substrate for changing an electrical connection state between the pixels and the driver,
wherein the switching means includes;
a first switching element located closer to one of the pixels,
a second switching element located closer to the driver, and
wherein a signal to turn ON the first switching element and a signal to turn ON the second switching element have mutually different polarities;
a power supply having a voltage range for supplying voltages to the data lines;
a power supply having a voltage range for supplying voltages to the counter electrode; and
wherein one of (1) the voltage range of the power supply for supplying voltages to the data lines is within the voltage range of the power supply for supplying voltages to the counter electrode or (2) the voltage range of the power supply for supplying voltages to the counter electrode is within the voltage range of the power supply for supplying voltages to the data lines.

24. A method for driving a display device, the display device comprising:
an active matrix substrate;
a counter substrate, which is disposed so as to face the active matrix substrate and includes a counter electrode; and
a d1spiay medium layer interposed between the active matrix and counter substrate,
wherein the active matrix substrate includes;
a baseplate;
a plurality of pixel electrodes formed on the base plate;
a plurality of pixel switching elements, each said pixel switching element being connected to associated one of the pixel electrode;
a plurality of gate lines for controlling operations of the pixel switching elements;
a plurality of data lines, each said data line being connected to associated ones of the pixel electrode by way of associated ones of the pixel switching elements so as to supply a data signal therethrough;

a plurality of data line switching elements, each said data line switching element having terminals, one of said terminals being connected to associated one of the data lines;

a plurality of signal input terminals, each said signal input terminal being connected to another terminal of associated one of the data line switching elements and another terminal of another associated one of the data line switching elements; and a data line branching section, which is provided between the signal input terminals and the data line switching elements; and a control line, which is connected to the data line switching elements to selectively turn ON or OFF the data line switching elements, wherein a signal to turn ON the data line switching elements and a signal to turn ON the pixel switching elements having mutually different polarities, and wherein the method drives the display device in such a manner that an interval, in which one of the pixel switching elements is turned OFF to hold a potential level of associated one of the data line as applied to associated one of the pixel electrodes overlaps at least partially with an interval, in which one of the data line switching elements that is associated with the data line is turn OFF to hold a potential level of the data signal on the data line, for the pixel electrode and the counter electrode that face each other via the display medium layer, and wherein a potential drop (or rise) associated with the data line switching elements being turned from ON to OFF and a potential drop (or rise) associated with the pixel switching elements being turned from ON to OFF is such as to minimize a variation in voltage being applied to the display medium.

25. A method for driving a display device, the display device comprising:

an active matrix substrate;

a counter substrate, which is disposed so as to face the active matrix substrate and includes a counter electrode; and a display medium layer interposed between the active matrix and counter substrate, wherein the active matrix substrate includes;

a baseplate plate;

a plurality of pixel electrodes formed on the base plate;

a plurality of pixel switching elements, each said pixel switching element being connected to associated one of the pixel electrodes;

a plurality of gate lines for controlling operations of the pixel switching elements;

a plurality of data lines, each said data line being connected to associated ones of the pixel electrodes by way of associated ones of the pixel switching elements so as to supply a data signal therethrough;

a plurality of data line switching elements, each said data line switching element having terminal, one of said terminals being connected to associated one of the data lines;

a plurality of signal input terminals, each said signal input terminal being connected to another terminal of associated one of the data line switching elements and another terminal of another associated one of the data line switching elements;

a data line branching section, which is provided between the signal input treminals and the data line switching elements; and a control line which is connected to the data line switching elements to selectively turn ON or OFF the data line switching elements, wherein a signal to turn ON the data line switching elements and a signal to turn ON the pixel switching elements have mutually different polarities, and wherein the method drives the display device in such a manner that an interval, in which one of the pixel switching elements is turned OFF to hold a potential level of associated one of the data lines as applied to associated one of the pixel electrodes, overlaps at least partially with an interval, in which one of the data line switching elements that is associated with the date line is turn OFF to hold a potential level of the data signal on the data line for the pixel electrode and the counter electrode that face each other via the display medium layer, and wherein a potential drop (or rise) associated with the data line switching elements being turned from ON to OFF and a potential drop (or rise) associated with the pixel switching elements being turned from ON to OFF is such that unfavorable direct current components are further reduced and so that a voltage at a level closer to a desired voltage is applied to the display medium.

26. The display driving method of claim 24, wherein voltages supplied to the data lines and the signal lines have mutually different polarity.

27. A method for driving a display device, the display device comprising:

an active matrix substrate;

a counter substrate, which is disposed so as to face the active matrix substrate and includes a counter electrode; and a display medium layer interposed between the active matrix and counter substrates, wherein the active matrix substrate includes;

a base plate;

a plurality of pixel electrodes formed on the base plate;

a plurality of pixel switching elements, each said pixel switching element being connected to associated one of the pixel electrodes;

a plurality of gate lines for controlling operations of the pixel switching elements;

a plurality of data lines, each said data line being connected to associated ones of the pixel electrode by way of associated ones of the pixel switching elements so as to supply a data signal therethrough;

a plurality of data line switching elements, each said data line switching element having terminals, one of said terminals being connected to associated one of the data lines;

a plurality of signal input terminals, each said signal input terminal being connected to another terminal of associated one of the data line switching elements and another terminal of another associated one of the data line switching elements;

a data line branching section, which is provided between the signal input terminals and the data line switching elements;

a control line which is connected to the data line switching elements to selectively turn ON or OFF the data line switching elements;

a power supply having a voltage range for supplying voltages to the data lines;

a power supply having a voltage range for supplying voltages to the counter electrode;

wherein one of (1) the voltage range of the power supply for supplying voltages to the data lines is within the voltage range of the power supply for supplying voltages to the counter electrode or (2) the voltage range of the power supply for supplying voltages to the counter electrode is within the voltage range of the power supply for supplying voltages to the data lines, and wherein a signal to turn ON the data line switching elements and a signal to turn ON the pixel switching elements have mutually different polarities; and wherein the method drives the display device in such a manner that an interval in which one of the pixel switching elements is turned OFF to hold a potential level of associated one of the data lines as applied to associated one of the pixel electrodes, overlaps at least partially with an interval, in which one of the data line switching elements that is associated with the data line is turned OFF to hold a potential level of the data signal on the data line, for the pixel electrode and the counter electrode that face each other via the display medium layer.

* * * * *